United States Patent
Kaleta et al.

(10) Patent No.: US 10,651,317 B2
(45) Date of Patent: May 12, 2020

(54) HIGH-VOLTAGE LATERAL GAN-ON-SILICON SCHOTTKY DIODE

(71) Applicant: MACOM Technology Solutions Holdings, Inc., Lowell, MA (US)

(72) Inventors: Anthony Kaleta, Lowell, MA (US); Douglas Carlson, Lowell, MA (US); Timothy E. Boles, Tyngsboro, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/223,455

(22) Filed: Jul. 29, 2016

(65) Prior Publication Data

US 2017/0301798 A1 Oct. 19, 2017

Related U.S. Application Data

(60) Provisional application No. 62/323,569, filed on Apr. 15, 2016, provisional application No. 62/323,564, filed on Apr. 15, 2016.

(51) Int. Cl.
| | | |
|---|---|---|
| *H01L 23/58* | (2006.01) | |
| *H01L 29/872* | (2006.01) | |
| *H01L 29/66* | (2006.01) | |
| *H01L 29/40* | (2006.01) | |
| *H01L 29/778* | (2006.01) | |
| *H01L 29/861* | (2006.01) | |

(Continued)

(52) U.S. Cl.
CPC ......... *H01L 29/872* (2013.01); *H01L 21/761* (2013.01); *H01L 29/0646* (2013.01); *H01L 29/0649* (2013.01); *H01L 29/2003* (2013.01); *H01L 29/205* (2013.01); *H01L 29/402* (2013.01); *H01L 29/404* (2013.01); *H01L 29/66143* (2013.01); *H01L 29/66212* (2013.01); *H01L 29/7786* (2013.01); *H01L 29/861* (2013.01); *H02M 7/003* (2013.01)

(58) Field of Classification Search
CPC . H01L 29/872; H01L 29/2003; H01L 29/402; H01L 29/0646; H01L 29/66143; H01L 21/761; H01L 29/205; H01L 29/7786; H01L 29/861; H01L 29/66212
USPC ......... 257/487, 192, 615, 200, 471
See application file for complete search history.

(56) References Cited

U.S. PATENT DOCUMENTS

| | | |
|---|---|---|
| 4,692,998 A | 9/1987 | Armstrong et al. |
| 4,737,236 A | 4/1988 | Perko et al. |

(Continued)

OTHER PUBLICATIONS

U.S. Appl. No. 15/223,614, filed Jul. 29, 2016, Boles et al.

(Continued)

*Primary Examiner* — Shouxiang Hu
(74) *Attorney, Agent, or Firm* — Wolf, Greenfield & Sacks, P.C.

(57) ABSTRACT

High-voltage, gallium-nitride Schottky diodes are described that are capable of withstanding reverse-bias voltages of up to and in excess of 2000 V with reverse current leakage as low as 0.4 microamp/millimeter. A Schottky diode may comprise a lateral geometry having an anode located between two cathodes, where the anode-to-cathode spacing can be less than about 20 microns. A diode may include at least one field plate connected to the anode that extends above and beyond the anode towards the cathodes.

24 Claims, 19 Drawing Sheets

(51) Int. Cl.
  *H01L 29/06* (2006.01)
  *H01L 29/20* (2006.01)
  *H01L 21/761* (2006.01)
  *H01L 29/205* (2006.01)
  *H02M 7/00* (2006.01)

(56) References Cited

U.S. PATENT DOCUMENTS

| | | | |
|---|---|---|---|
| 5,268,310 A | 12/1993 | Goodrich et al. | |
| 5,343,070 A | 8/1994 | Goodrich et al. | |
| 5,696,466 A | 12/1997 | Li | |
| 5,877,530 A | 3/1999 | Aronowitz et al. | |
| 5,976,941 A | 11/1999 | Boles et al. | |
| 6,014,064 A | 1/2000 | Boles et al. | |
| 6,114,716 A | 9/2000 | Boles et al. | |
| 6,150,197 A | 11/2000 | Boles et al. | |
| 6,197,645 B1 | 3/2001 | Michael et al. | |
| 6,329,702 B1 | 12/2001 | Gresham et al. | |
| 6,379,785 B1 | 4/2002 | Ressler et al. | |
| 6,465,289 B1 | 10/2002 | Streit et al. | |
| 6,600,199 B2 | 7/2003 | Johnson et al. | |
| 7,026,223 B2 | 4/2006 | Goodrich et al. | |
| 7,071,498 B2 | 7/2006 | Johnson et al. | |
| 7,223,441 B2 | 5/2007 | Remington et al. | |
| 7,402,842 B2 | 7/2008 | Goodrich | |
| 7,419,892 B2 * | 9/2008 | Sheppard | H01L 21/046 257/183 |
| 7,692,263 B2 | 4/2010 | Wu et al. | |
| 7,709,859 B2 | 5/2010 | Smith et al. | |
| 7,719,091 B2 | 5/2010 | Brogle | |
| 7,745,848 B1 | 6/2010 | Rajagopal et al. | |
| 7,755,173 B2 | 7/2010 | Mondi et al. | |
| 7,858,456 B2 | 12/2010 | Chiola et al. | |
| 7,868,428 B2 | 1/2011 | Goodrich et al. | |
| 8,237,198 B2 * | 8/2012 | Wu | H01L 29/2003 257/183 |
| 8,912,610 B2 | 12/2014 | Lin et al. | |
| 8,946,724 B1 | 2/2015 | Shinohara et al. | |
| 9,142,659 B2 * | 9/2015 | Dora | H01L 29/1608 |
| 9,281,417 B1 * | 3/2016 | Lin | H01L 29/872 |
| 9,799,760 B2 | 10/2017 | Green et al. | |
| 9,818,856 B2 | 11/2017 | Hoshi et al. | |
| 9,837,521 B2 | 12/2017 | Yamamoto et al. | |
| 9,837,524 B2 | 12/2017 | Miyake et al. | |
| 9,853,108 B2 | 12/2017 | Kawaguchi | |
| 9,893,174 B2 | 2/2018 | Chowdhury et al. | |
| 9,911,817 B2 | 3/2018 | Ling et al. | |
| 9,935,190 B2 | 4/2018 | Wu et al. | |
| 2002/0139971 A1 | 10/2002 | Eda | |
| 2003/0141518 A1 | 7/2003 | Yokogawa et al. | |
| 2005/0145851 A1 | 7/2005 | Johnson et al. | |
| 2007/0018199 A1 | 1/2007 | Sheppard et al. | |
| 2007/0126067 A1 | 6/2007 | Hattendorf et al. | |
| 2008/0265379 A1 | 10/2008 | Brandes et al. | |
| 2008/0308813 A1 | 12/2008 | Suh et al. | |
| 2009/0026498 A1 | 1/2009 | Matsuda | |
| 2009/0267078 A1 | 10/2009 | Mishra et al. | |
| 2010/0019279 A1 | 1/2010 | Chen et al. | |
| 2010/0117146 A1 | 5/2010 | Ikeda et al. | |
| 2011/0049526 A1 | 3/2011 | Chu et al. | |
| 2012/0223320 A1 | 9/2012 | Dora et al. | |
| 2013/0043517 A1 | 2/2013 | Yin et al. | |
| 2014/0103357 A1 | 4/2014 | Decoutere et al. | |
| 2014/0159116 A1 | 6/2014 | Briere et al. | |
| 2014/0231823 A1 | 8/2014 | Chowdhury et al. | |
| 2014/0306235 A1 | 10/2014 | Decoutere et al. | |
| 2015/0294984 A1 | 10/2015 | Cheng et al. | |
| 2015/0303291 A1 | 10/2015 | Makiyama et al. | |
| 2016/0086938 A1 | 3/2016 | Kinzer | |
| 2016/0155674 A1 | 6/2016 | Cho et al. | |
| 2016/0190298 A1 | 6/2016 | Wu et al. | |
| 2016/0233235 A1 | 8/2016 | Miyairi et al. | |
| 2017/0133500 A1 | 5/2017 | Etou et al. | |
| 2017/0301780 A1 | 10/2017 | Boles et al. | |
| 2017/0301781 A1 | 10/2017 | Boles et al. | |
| 2017/0301799 A1 | 10/2017 | Boles et al. | |
| 2017/0317202 A1 | 11/2017 | Green et al. | |
| 2017/0338171 A1 | 11/2017 | Cho et al. | |
| 2017/0345812 A1 | 11/2017 | Chou et al. | |
| 2018/0175268 A1 | 6/2018 | Moon et al. | |
| 2018/0248009 A1 | 8/2018 | Wong et al. | |
| 2018/0295683 A1 | 10/2018 | Tung et al. | |
| 2019/0229114 A1 | 7/2019 | Boles et al. | |
| 2019/0229115 A1 | 7/2019 | Boles et al. | |
| 2019/0341480 A1 | 11/2019 | Boles et al. | |

OTHER PUBLICATIONS

U.S. Appl. No. 15/223,677, filed Jul. 29, 2016, Boles et al.
U.S. Appl. No. 15/223,734, filed Jul. 29, 2016, Boles et al.
Tangsheng et al., AlGaN/GaN MIS HEMT with AlN Dielectric. GaAs Mantech Conf Proc. 2006: 227-30.
Invitation to Pay Additional Fees for Application No. PCT/US2017/027779 dated Oct. 5, 2017.
International Search Report and Written Opinion for Application No. PCT/US2017/027779 dated Nov. 29, 2017.
International Search Report and Written Opinion dated Dec. 21, 2017 for Application No. PCT/US2017/027780.
Invitation to Pay Additional Fees for Application No. PCT/US2017/027780 dated Sep. 25, 2017.
Written Opinion for Application No. PCT/US2017/027779 dated May 8, 2018.
Written Opinion for Application No. PCT/US2017/027780 dated May 30, 2018.
Tsou et al., 2.07-kV AlGaN/GaN Schottky Barrier Diodes on Silicon With High Baliga's Figure-of-Merit. IEEE Electron Device Letters. Jan. 2016;37(1):70-3.
U.S. Appl. No. 15/223,614, Boles et al., dated Jul. 29, 2016.
U.S. Appl. No. 15/223,677, Boles et al., dated Jul. 29, 2016.
U.S. Appl. No. 16/199,408, Boles et al., dated Nov. 26, 2018.
U.S. Appl. No. 15/875,406, Boles et al., dated Jan. 19, 2018.
U.S. Appl. No. 15/875,441, Boles et al., dated Jan. 19, 2018.
U.S. Appl. No. 16/431,480, Boles et al., dated Jun. 4, 2019.
Ch. II International Preliminary Report on Patentability for International Application No. PCT/US2017/027779, dated Aug. 9, 2018.
Ch. II International Preliminary Report on Patentability for International Application No. PCT/US2017/027780, dated Jul. 24, 2018.
U.S. Appl. No. 16/199,408, filed Nov. 26, 2018, Boles et al.
U.S. Appl. No. 15/875,406, filed Jan. 19, 2018, Boles et al.
U.S. Appl. No. 15/875,441, filed Jan. 19, 2018, Boles et al.
U.S. Appl. No. 16/431,480, filed Jun. 4, 2019, Boles et al.
PCT/US2017/02779, dated Aug. 9, 2018, Ch. II International Preliminary Report on Patentability.
PCT/US2017/027780, dated Jul. 24, 2018, Ch. II International Preliminary Report on Patentability.

* cited by examiner

HIGH-VOLTAGE LATERAL GAN-ON-SILICON SCHOTTKY DIODE

CROSS REFERENCE TO RELATED APPLICATIONS

This application claims priority to U.S. provisional application No. 62/323,564, filed Apr. 15, 2016, titled "High-Voltage Lateral GaN-on-Silicon Schottky Diode" and to U.S. provisional application No. 62/323,569, filed Apr. 15, 2016, titled "High-Voltage Lateral GaN-on-Silicon Schottky Diode with Reduced Junction Leakage Current." Each of the foregoing applications is hereby incorporated by reference in its entirety.

BACKGROUND

Technical Field

The technology relates to high-voltage Schottky diodes formed from gallium-nitride materials.

Discussion of the Related Art

Gallium-nitride semiconductor material has received appreciable attention in recent years because of its desirable electronic and electro-optical properties. Gallium nitride (GaN) has a wide, direct bandgap of about 3.4 eV that corresponds to the blue wavelength region of the visible spectrum. Light-emitting diodes (LEDs) and laser diodes (LDs) based on GaN and its alloys have been developed and are commercially available. These devices can emit visible light ranging from the violet to red regions of the visible spectrum.

Because of its wide bandgap, gallium nitride is more resistant to avalanche breakdown and has a higher intrinsic field strength compared to more common semiconductor materials, such as silicon and gallium arsenide. In addition, gallium nitride is a wide bandgap semiconductor and is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide. Accordingly, GaN is useful for high-speed, high-voltage, and high-power applications. For example, gallium-nitride materials are useful in semiconductor amplifiers for radio-frequency (RF) communications, radar, and microwave applications.

Schottky diodes typically comprise metal-semiconductor junctions that exhibit lower threshold voltages than semiconductor-semiconductor junctions. Because of their lower threshold voltages and much smaller depletion regions, Schottky diodes can switch from conducting to non-conducting states much more quickly than semiconductor-semiconductor junction diodes. In some cases, a Schottky diode can switch several orders of magnitude faster than a semiconductor-semiconductor diode, and may operate at terahertz frequencies. Silicon-based Schottky diodes can exhibit reverse-bias breakdown voltages of up to about 100 V.

SUMMARY

Structures and methods for forming high-voltage Schottky diodes with gallium-nitride material are described. In some implementations, the diodes may be formed from one or more layers of gallium-nitride material deposited on a substrate of a different material (e.g., silicon or silicon carbide). The Schottky diodes may be arranged in a lateral, anode-cathode configuration, and may be capable of withstanding reverse bias voltages as much as 2000 volts. The high-voltage diodes may be useful for high-frequency power electronics and microwave applications including radar, and RF communications applications among other applications.

According to some embodiments, a Schottky diode comprises a gallium-nitride conduction layer, a barrier layer formed adjacent to the gallium-nitride conduction layer, a first cathode and a second cathode that are spaced apart and electrically connected to the gallium-nitride conduction layer, and an anode formed adjacent to the barrier layer between the first cathode and the second cathode. A Schottky diode may further include at least one anode-connected field plate electrically connected to the anode and extending on opposite edges beyond the anode toward the first cathode and the second cathode, wherein the Schottky diode is capable of withstanding a reverse bias voltage as much as 1000 volts.

In some implementations, a Schottky diode is capable of withstanding a reverse bias voltage as much as 1200 volts. In some aspects, a Schottky diode may further comprise a buffer layer formed between the gallium-nitride conduction layer and a substrate, wherein a combined thickness of the buffer layer and gallium-nitride conduction layer is at least 4.5 microns. In some cases, the substrate comprises silicon.

In some implementations, the barrier layer of a Schottky diode comprises aluminum gallium nitride. The diode may further comprise a gallium-nitride cap layer formed over the barrier layer. In some aspects, a Schottky diode may further include electrical isolation regions formed adjacent to the first and second cathodes, wherein the electrical isolation regions comprise damaged crystalline semiconductor that includes one or more of the following implanted ion species: nitrogen, phosphorous, boron, and argon. In some cases, a Schottky diode may further comprise at least one additional anode spaced laterally from the first or second cathode and electrically connected to the anode.

In some Schottky diode implementations, a distance between an edge of the first or second cathode and an edge of the anode is less than 20 microns. Alternatively, a distance between an edge of the first or second cathode and an edge of the anode may be less than 15 microns. According to some aspects, the at least one anode-connected field plate comprises a first anode-connected field plate electrically connected to the anode and extending on opposite edges beyond the anode toward the first cathode and the second cathode by a first distance, and a second anode-connected field plate electrically connected to the first anode-connected field plate and extending on opposite edges beyond the first anode-connected field plate toward the first cathode and the second cathode by a second distance. In some cases, the second distance is less than the first distance. Such a Schottky diode may further include a first insulating dielectric layer between at least a portion of the barrier layer and at least a portion of the first anode-connected field plate, and a second insulating dielectric layer separating at least a portion of the first anode-connected field plate and at least a portion of the second anode-connected field plate. In some implementations, a thickness of the first insulating dielectric layer is between approximately 30 nm and approximately 100 nm, and a thickness of the second insulating dielectric layer is between approximately 300 nm and approximately 600 nm. In some instances, a distance between an outer edge of the second anode-connected field plate and an outer edge of the first anode-connected field plate is between approximately 1 micron and approximately 4 microns. An outer edge of the anode, an outer edge of the first anode-connected field plate, and an outer edge of the second anode-connected field plate may lie approximately along a curve bending away from the Schottky diode's barrier layer. In some cases, the anode, first cathode, second cathode, and first anode-connected field plate are formed of a same material.

According to some implementations, the at least one anode-connected field plate further comprises a third anode-connected field plate that is electrically connected to the second anode-connected field plate. The third anode-connected field plate may extend on opposite edges beyond the second anode-connected field plate toward the first cathode and the second cathode by a third distance. The third distance may be less than the second distance, which is an amount that the second anode-connected field plate extends beyond the first anode-connected field plate. In some cases, an outer edge of the anode, an outer edge of the first anode-connected field plate, an outer edge of the second anode-connected field plate, and an outer edge of the third anode-connected field plate may lie approximately along a curve bending away from the barrier layer's top surface. In some implementations, a distance between an edge of the first or second cathode and an edge of the anode is between approximately 10 microns and approximately 20 microns. In some aspects, a Schottky diode having at least two anode-connected field plates may further comprise a buffer layer formed between the gallium-nitride conduction layer and a substrate, wherein a combined thickness of the buffer layer and gallium-nitride conduction layer is at least 4.5 microns.

In some aspects, a Schottky diode including at least two anode-connected field plates is capable of withstanding a reverse bias voltage of up to 1500 volts. In some instances, a Schottky diode including at least two anode-connected field plates is capable of withstanding a reverse bias voltage of up to 2000 volts. According to some implementations, a Schottky diode according to the described embodiments may be included in a power converter.

Methods for making Schottky diodes are also described. According to some embodiments, a method for fabricating a Schottky diode may comprise acts of depositing a buffer layer and a gallium-nitride conduction layer that have a combined thickness of at least 4.5 microns on a substrate, and depositing a barrier layer over the gallium-nitride conduction layer. A method of fabrication may further include depositing a first insulating dielectric layer over the barrier layer, opening an anode via in the first insulating dielaectric layer, patterning a resist over remaining portions of the first insulating dielectric layer, and depositing, in a single deposition step, an anode and a first anode-connected field plate that electrically connect to at least the barrier layer.

According to some implementations, a method for making Schottky diodes may further comprise forming an edge of the anode between approximately 10 microns and approximately 20 microns from an edge of a first cathode or a second cathode. In some cases, further acts include removing the resist, depositing a second insulating dielectric layer over the Schottky diode, opening a via to the first anode-connected field plate, and depositing a second anode-connected field plate that electrically connects to the first anode-connected field plate, wherein a planarization step may not be used between the acts of removing the resist and depositing the second anode-connected field plate. In some cases, a method may further comprise forming a third anode-connected field plate that electrically connects to the second anode-connected field plate. In some instances, a method for making Schottky diodes may include acts of depositing the first insulating dielectric layer to a thickness between approximately 30 nm and approximately 100 nm, and depositing the second insulating dielectric layer to a thickness between approximately 300 nm and approximately 600 nm. In some implementations, a method includes locating an outer edge of the anode, an outer edge of the first anode-connected field plate, and an outer edge of the second anode-connected field plate approximately along a curve that bends away from the device's barrier layer.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Figure 1A:
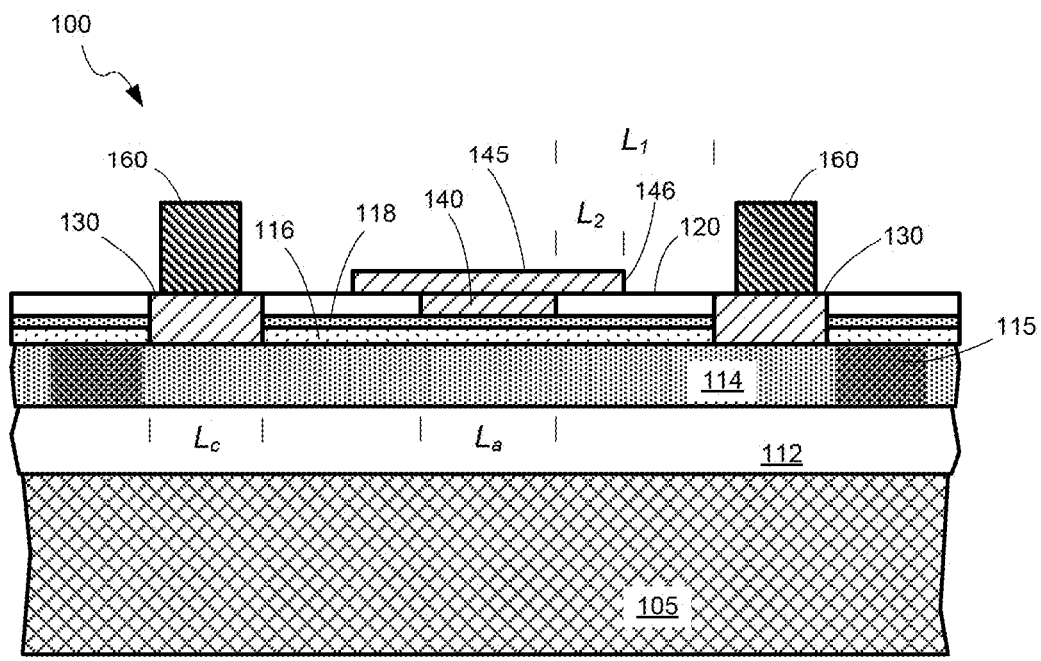
FIG. 1A depicts an elevation view of structure of a lateral, high-voltage Schottky diode comprising gallium-nitride material, according to some embodiments.
Figure 1B:
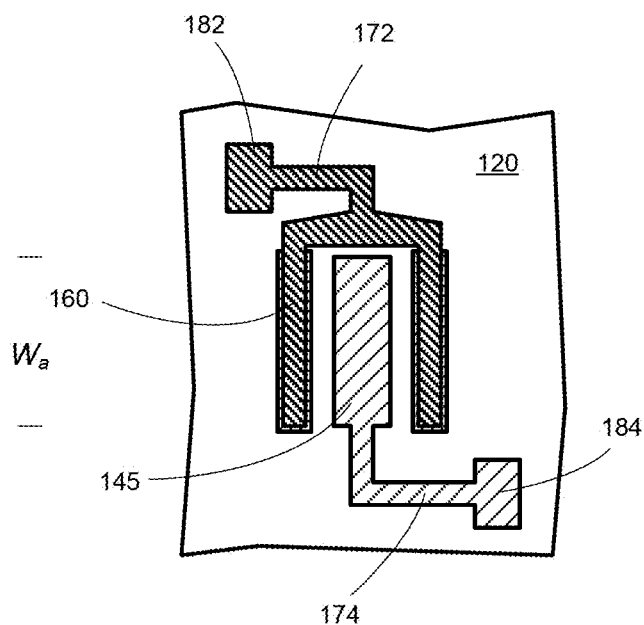
FIG. 1B depicts a plan view of a lateral, high-voltage Schottky diode comprising gallium-nitride material, according to some embodiments.
Figure 1C:
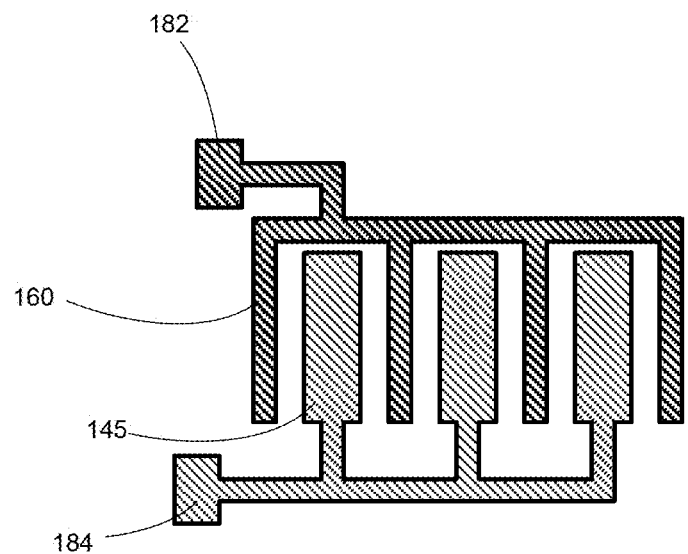
FIG. 1C depicts a plan view of multiple anode and cathode contacts for a high-voltage Schottky diode comprising gallium-nitride material, according to some embodiments.
Figure 3:
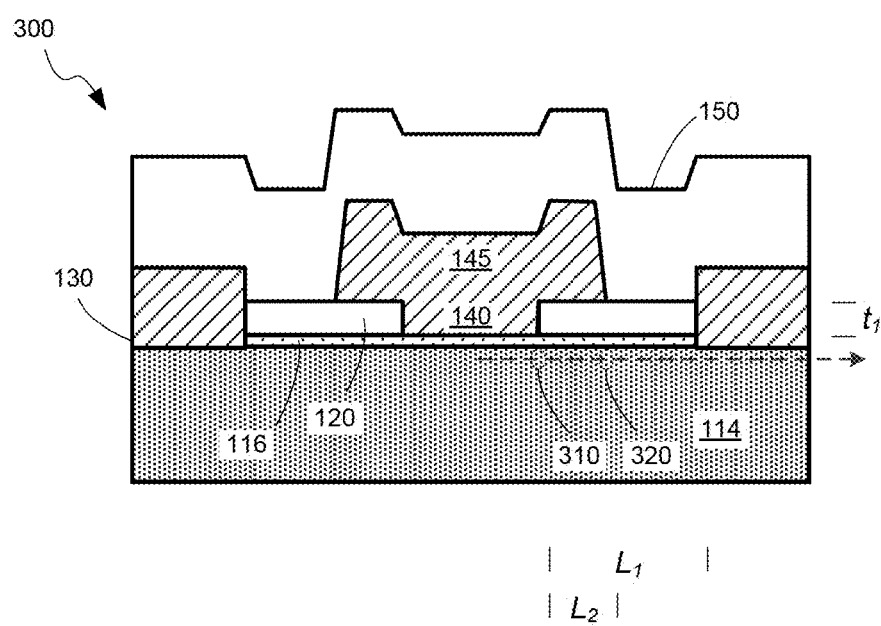
FIG. 3 depicts an elevation view of structure of a high-voltage Schottky diode having one anode-connected field plate, for which electric field simulations were carried out.
Figure 5:
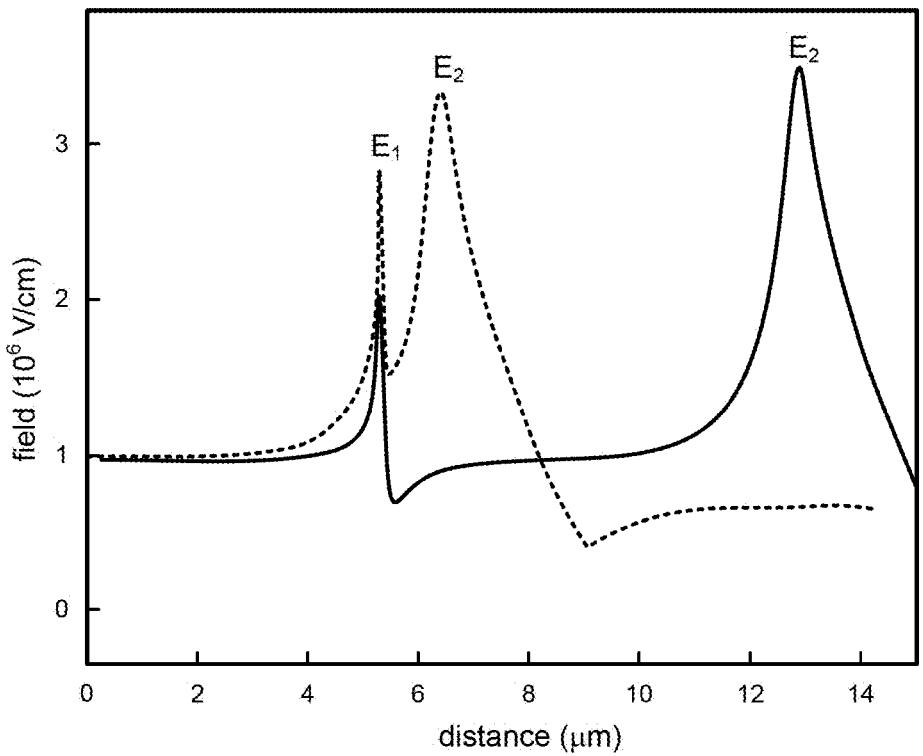
Figure 6A:
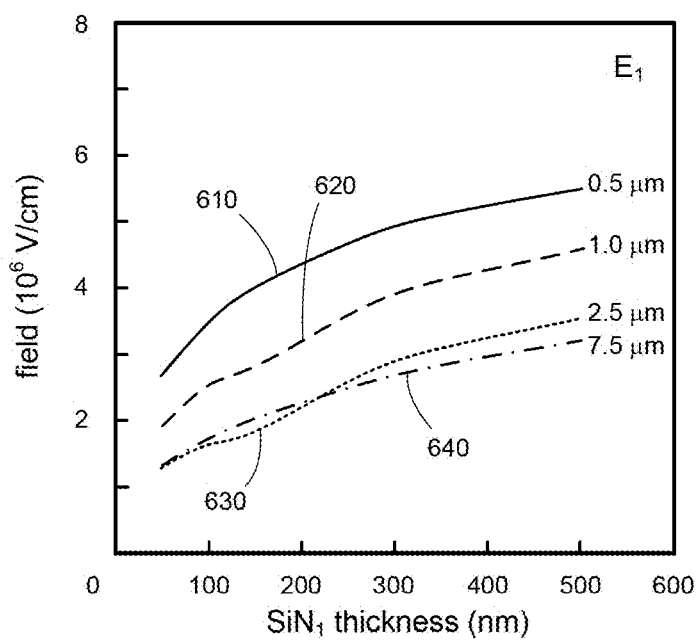
Figure 6B:
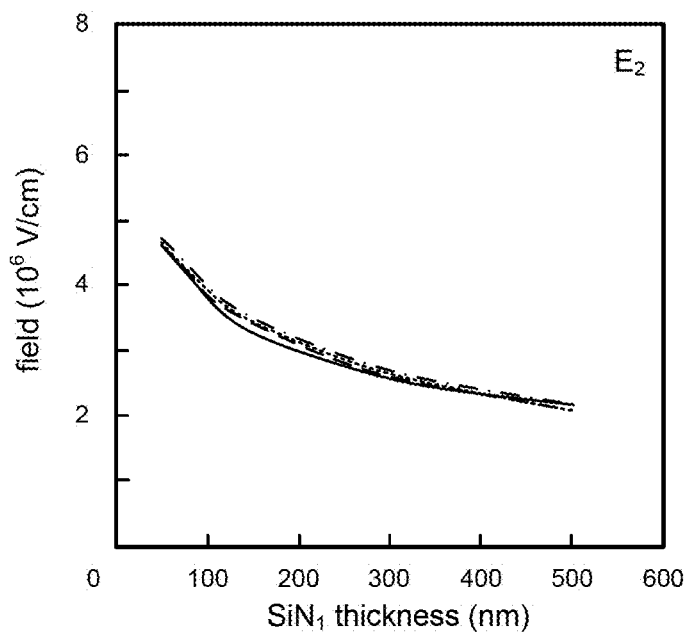
Figure 7:
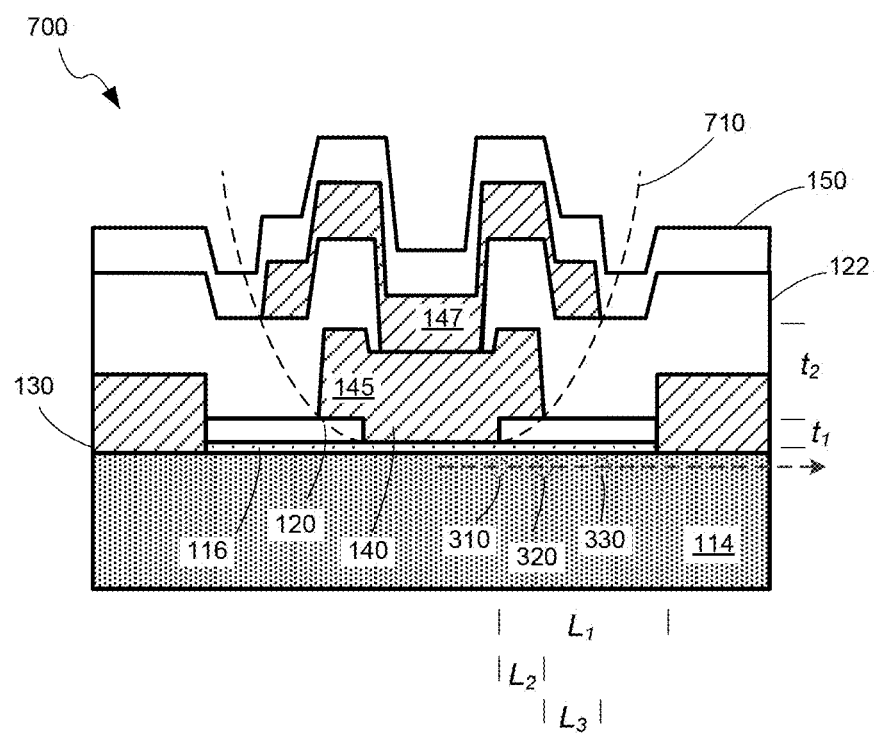
Figure 8:
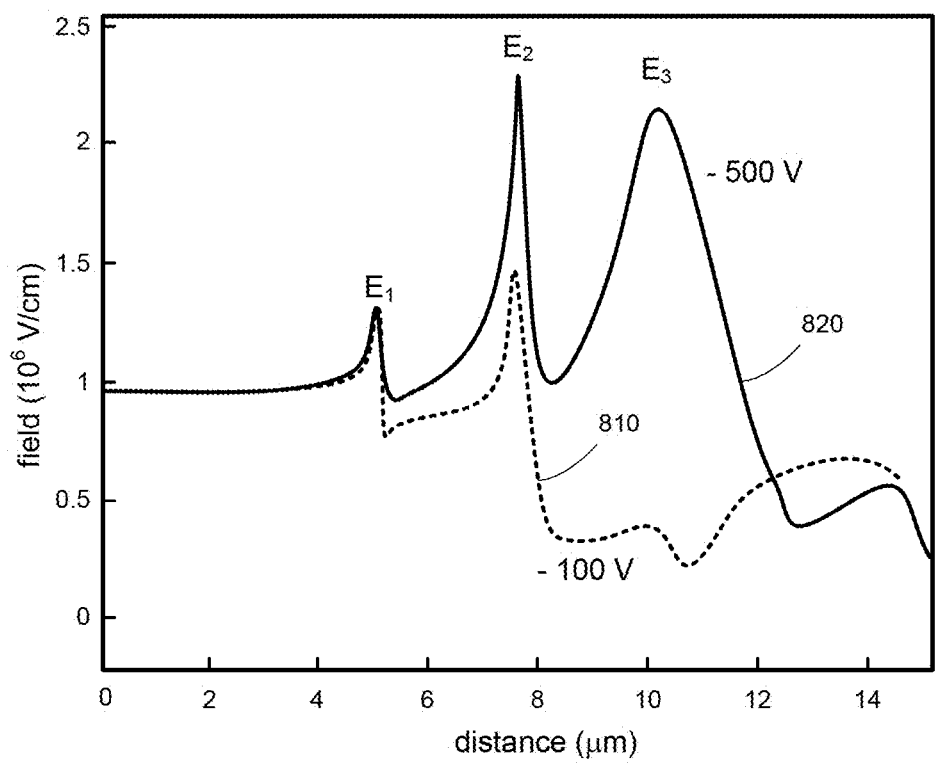
Figure 9A:
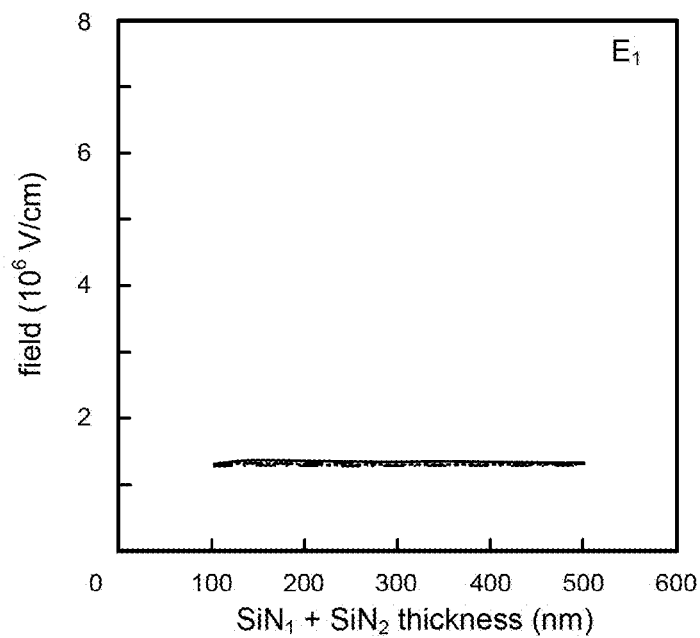
Figure 9B:
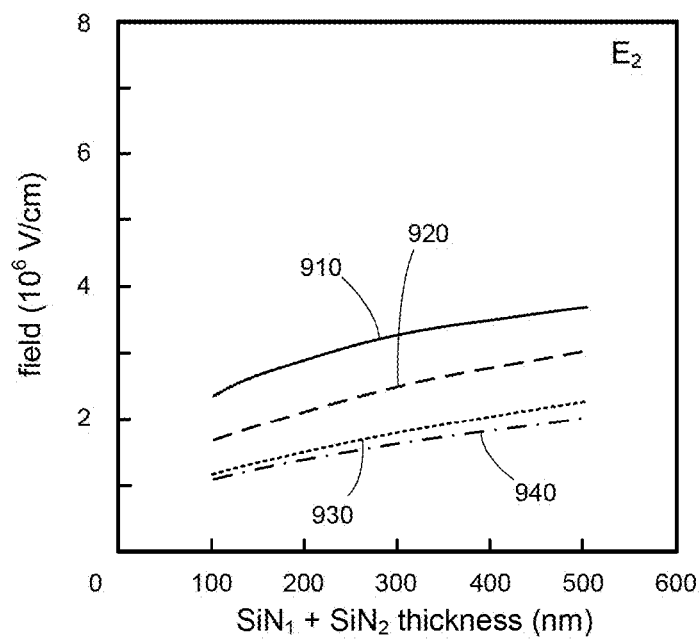
Figure 9C:
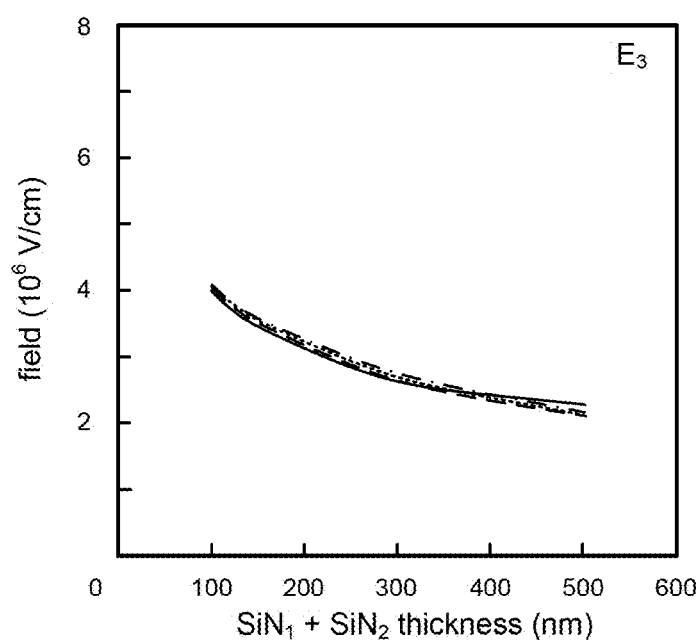
Figure 10:
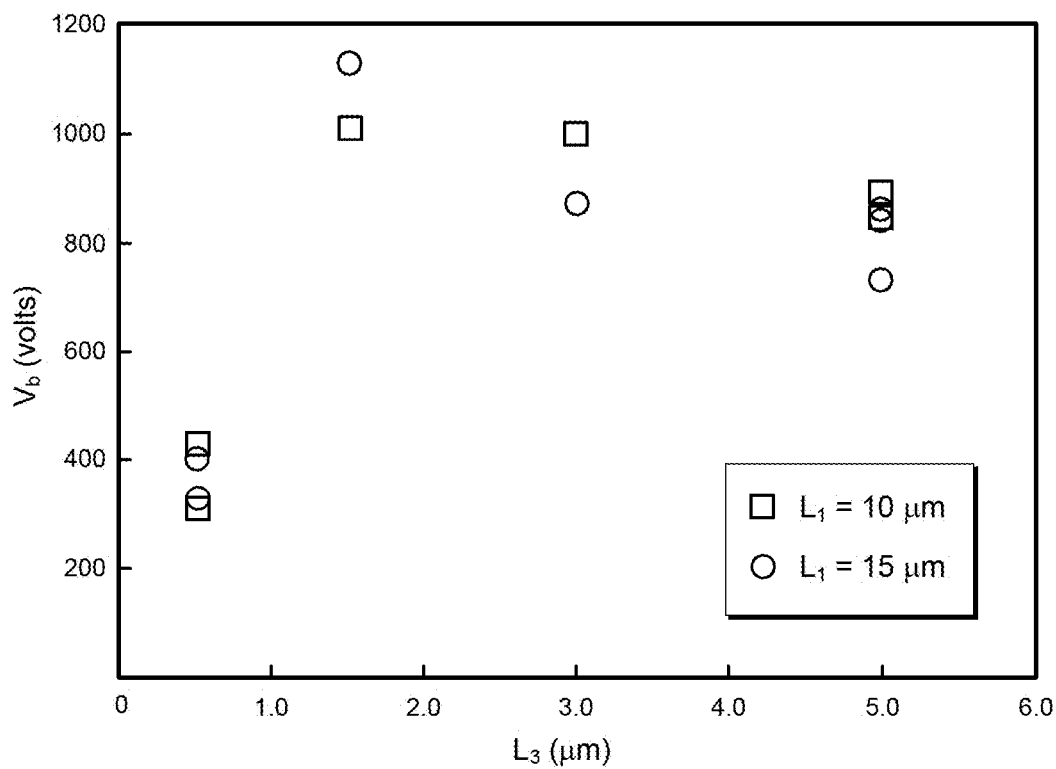
Figure 11:
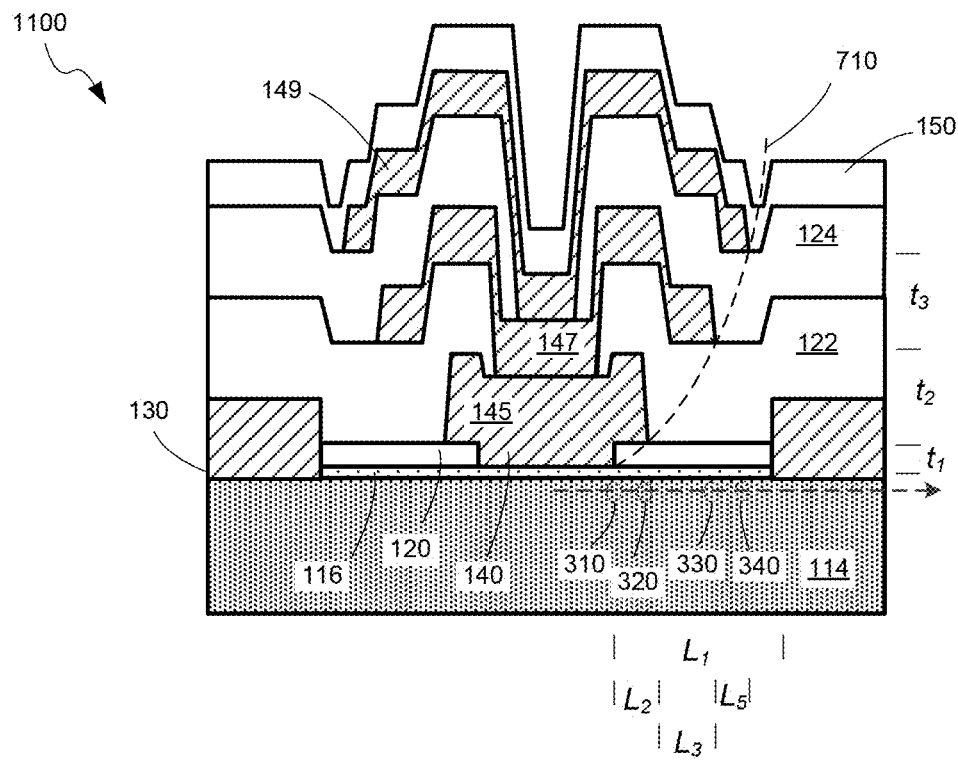
Figure 12A:
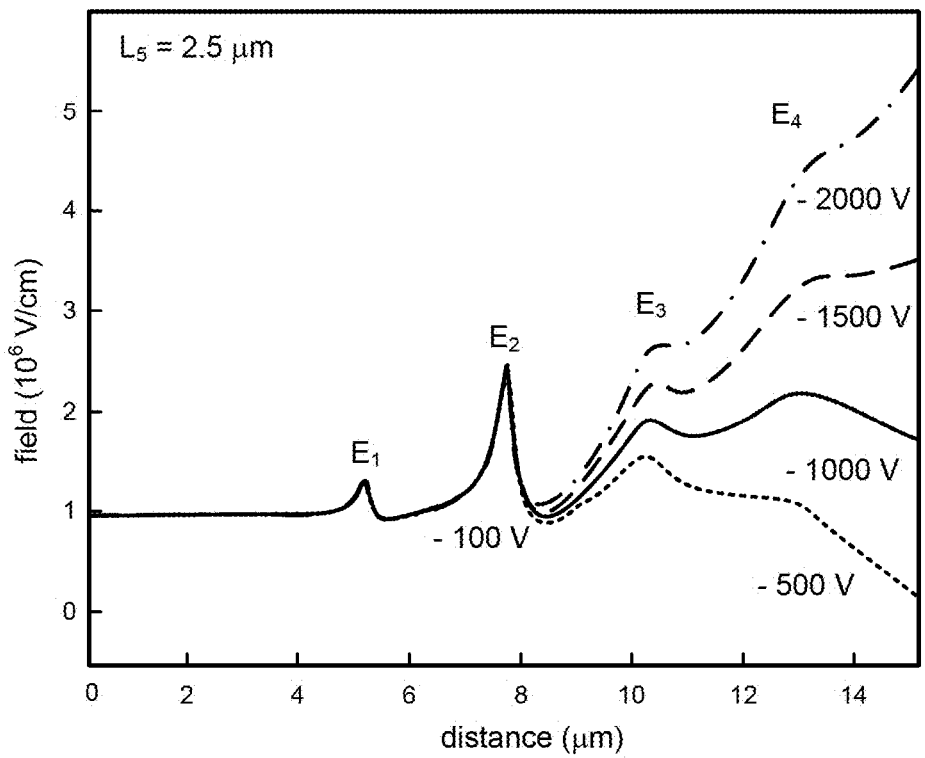
Figure 12B:
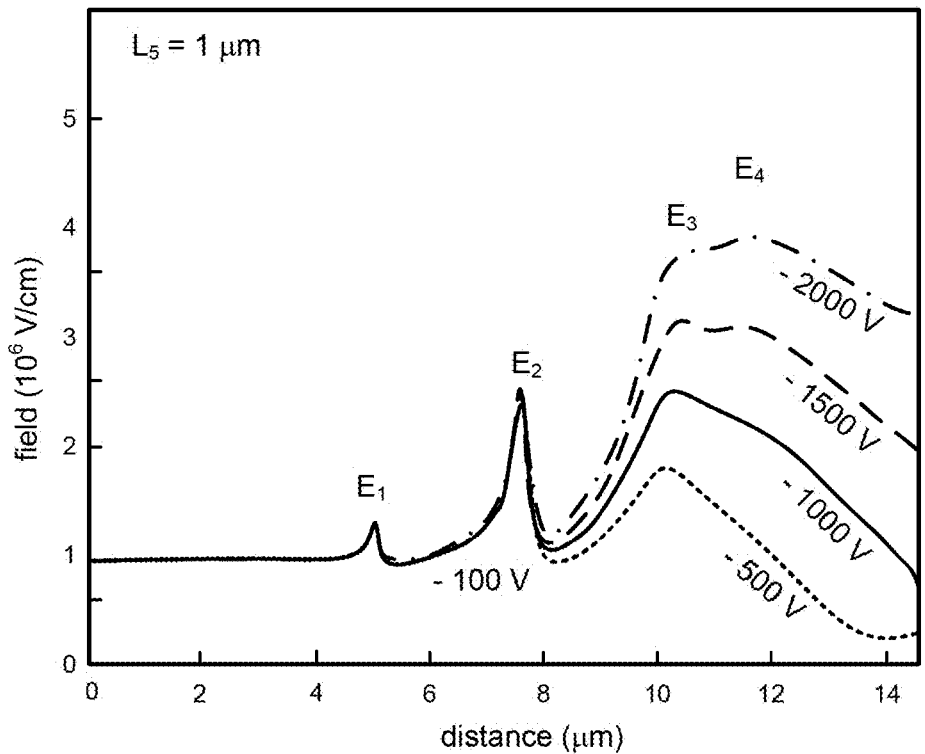
Figures 1A, 13:
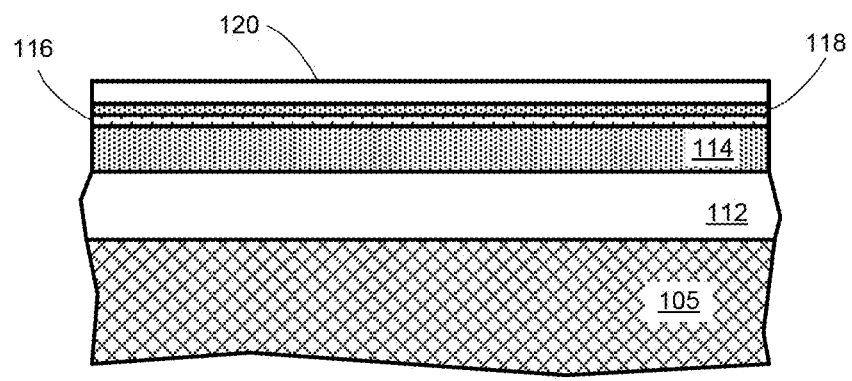
Figures 1B, 13:
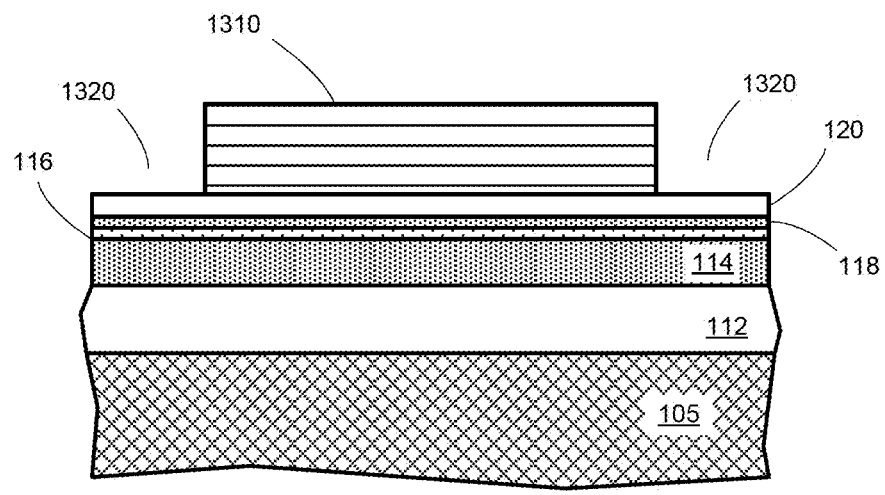
Figures 1C, 13:
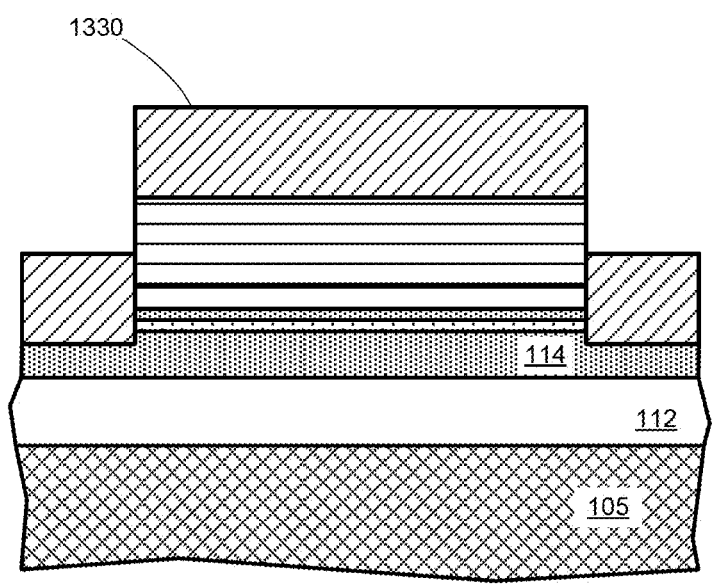
Figures 1D, 13:
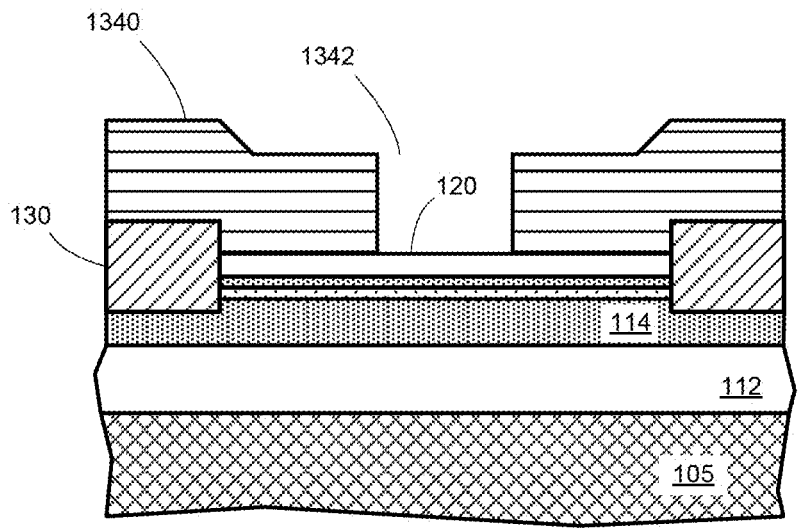
Figures 1E, 13:
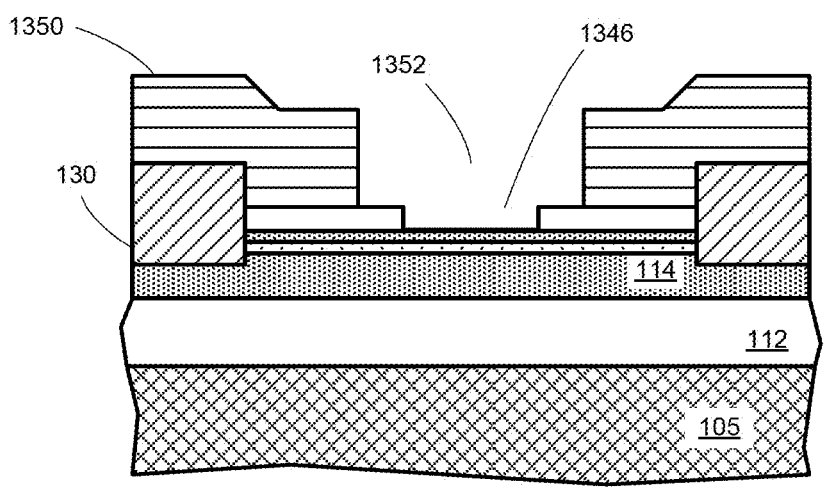
Figures 1F, 13:
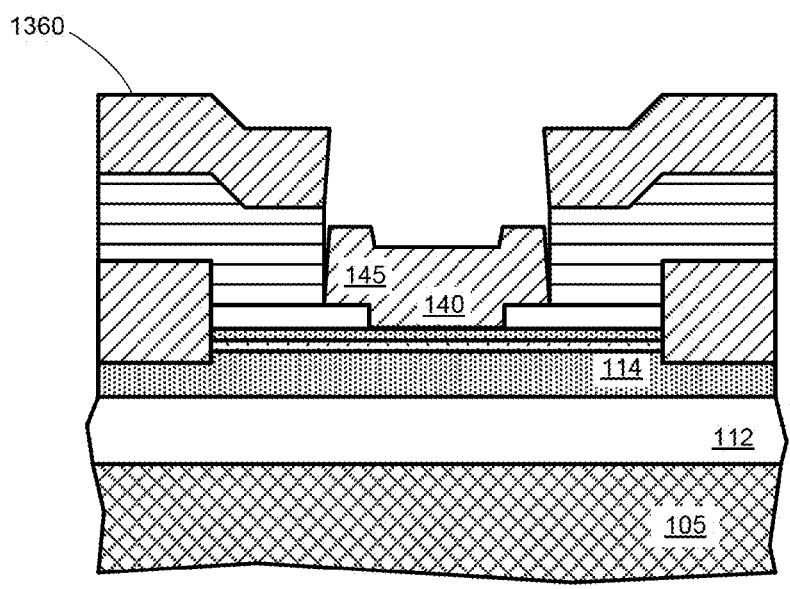
Figures 1G, 13:
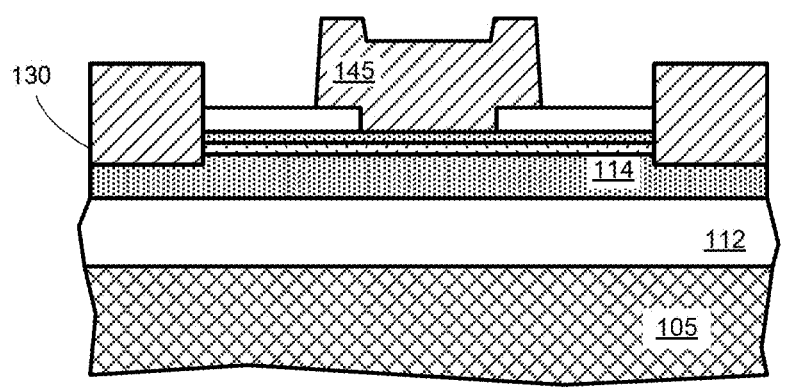
Figures 1H, 13:
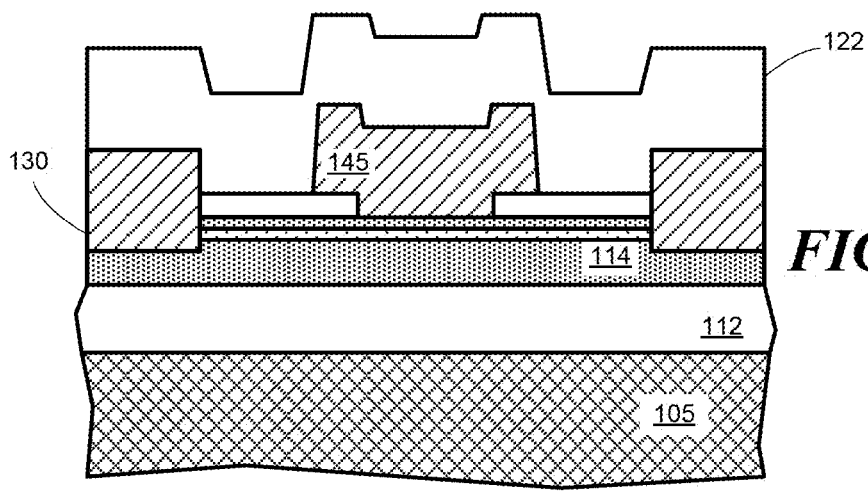
Figures 1I, 13:
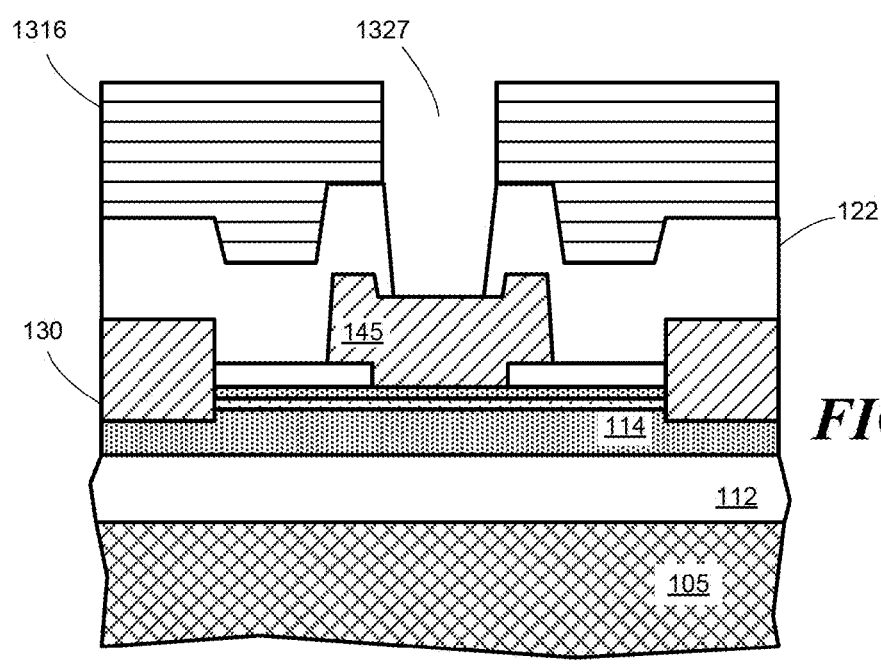
Figures 1J, 13:
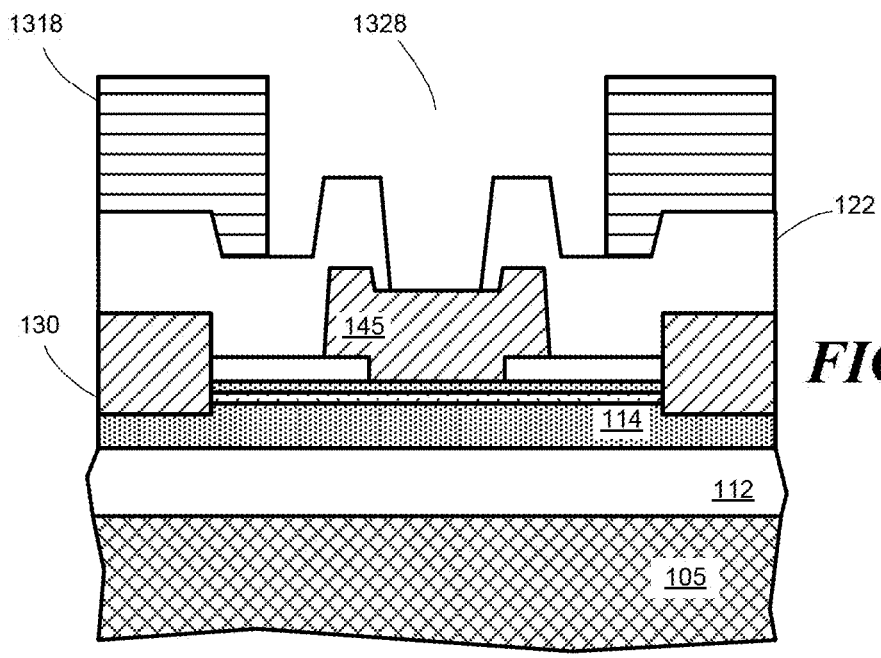
Figures 1K, 13:
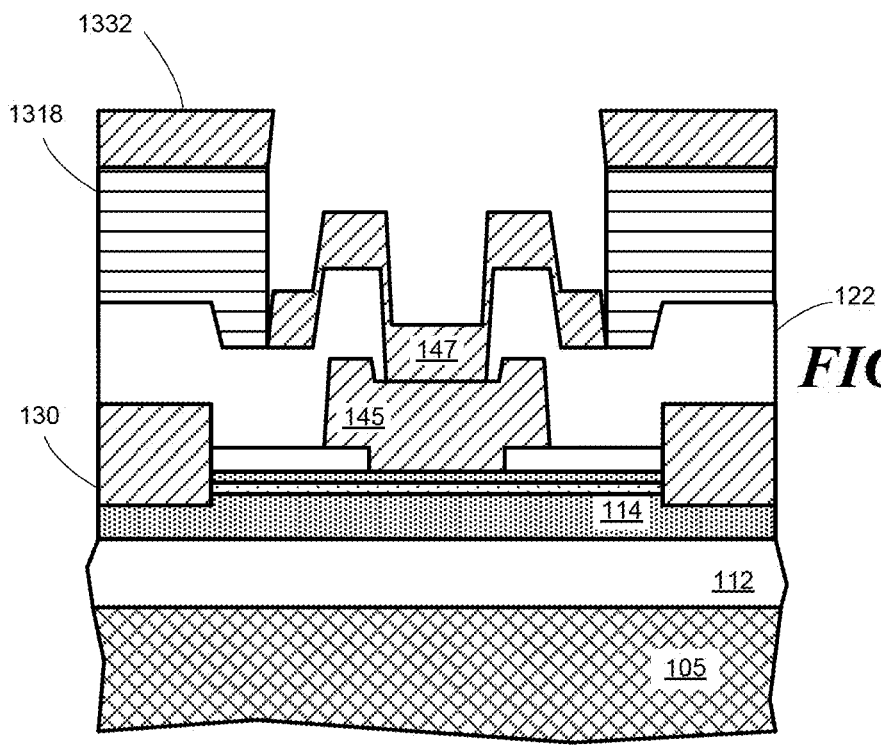
Figures 2A, 13:
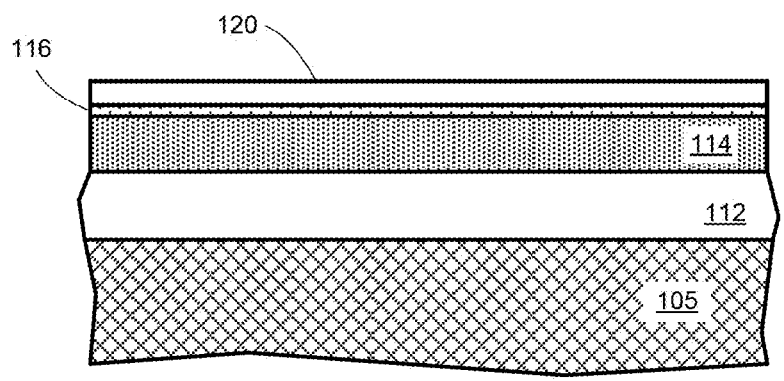
Figures 2B, 13:
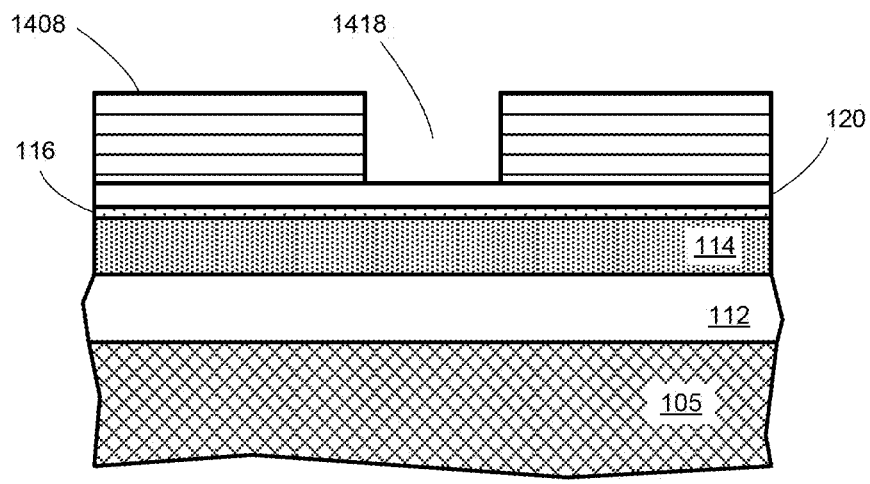
Figures 2C, 13:
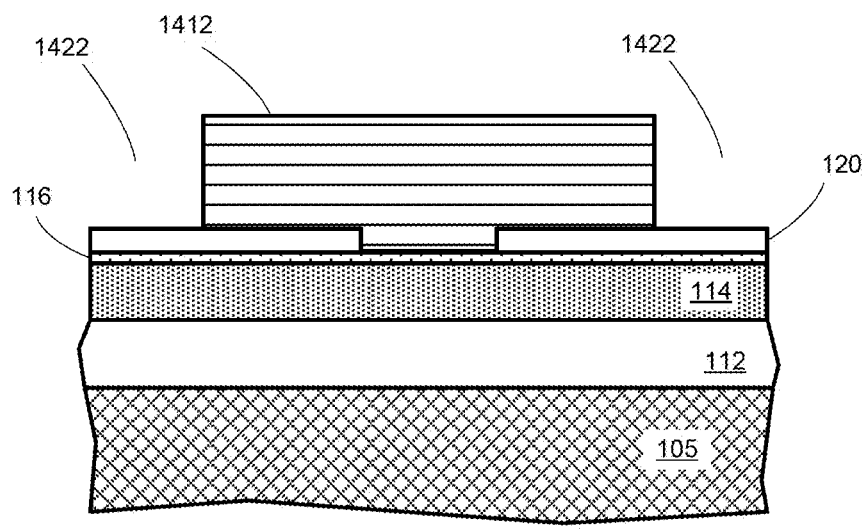
Figures 2D, 13:
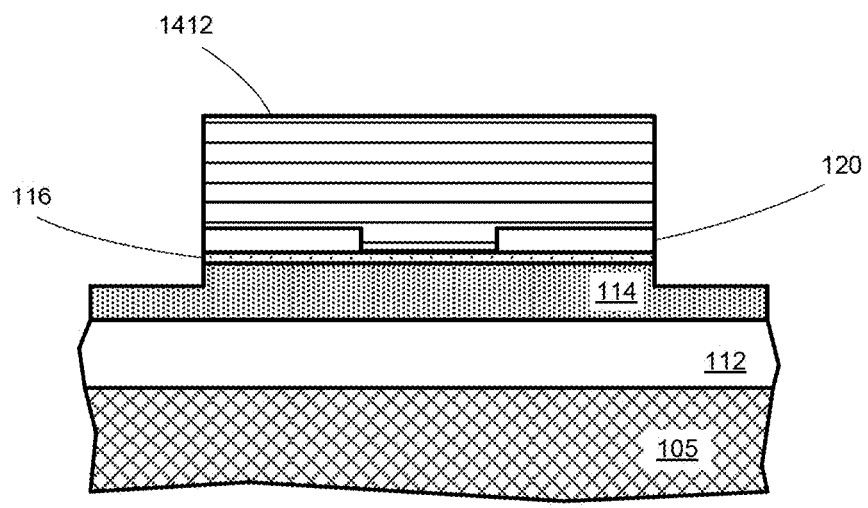
Figures 2E, 13:
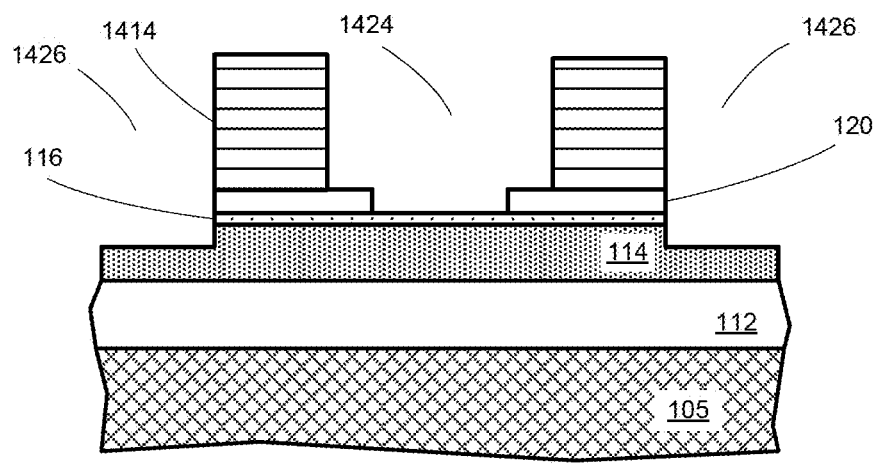
Figures 2F, 13:
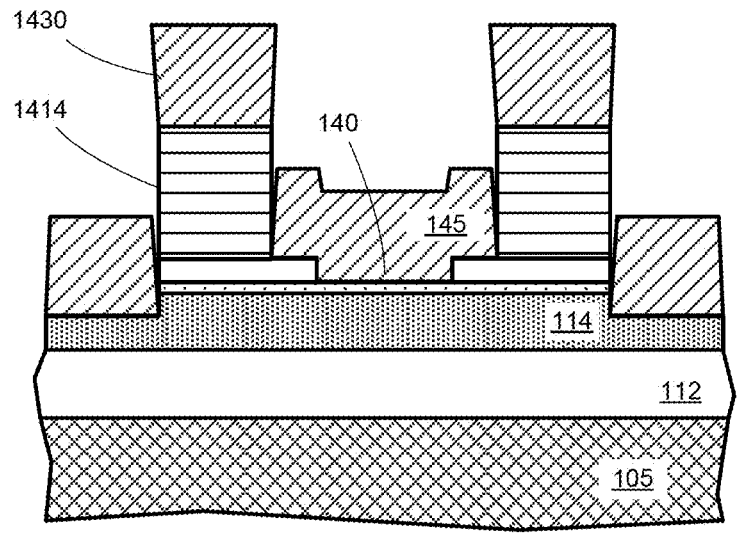
Figure 14:
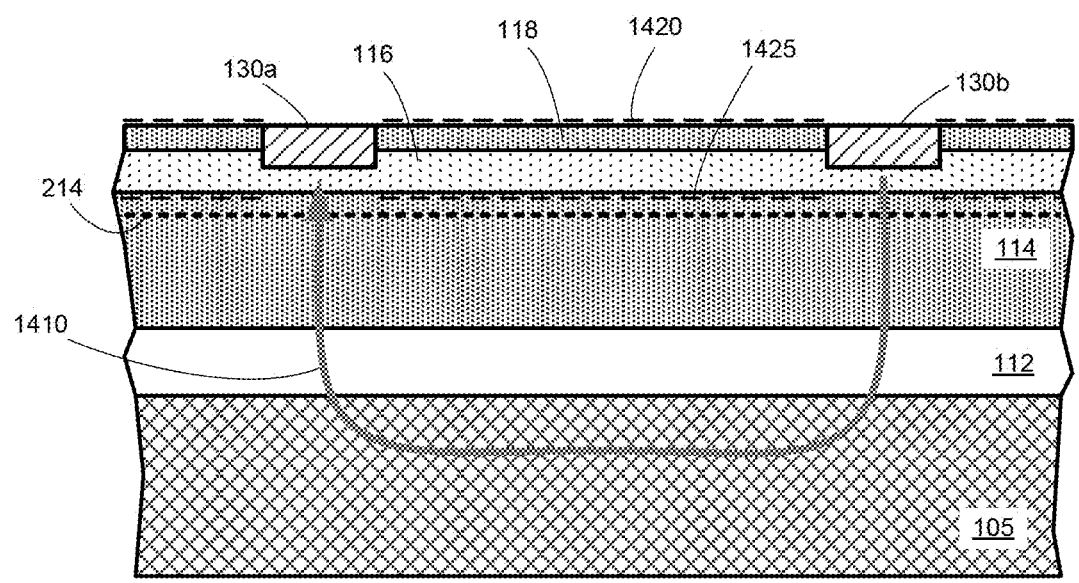
Figure 15:
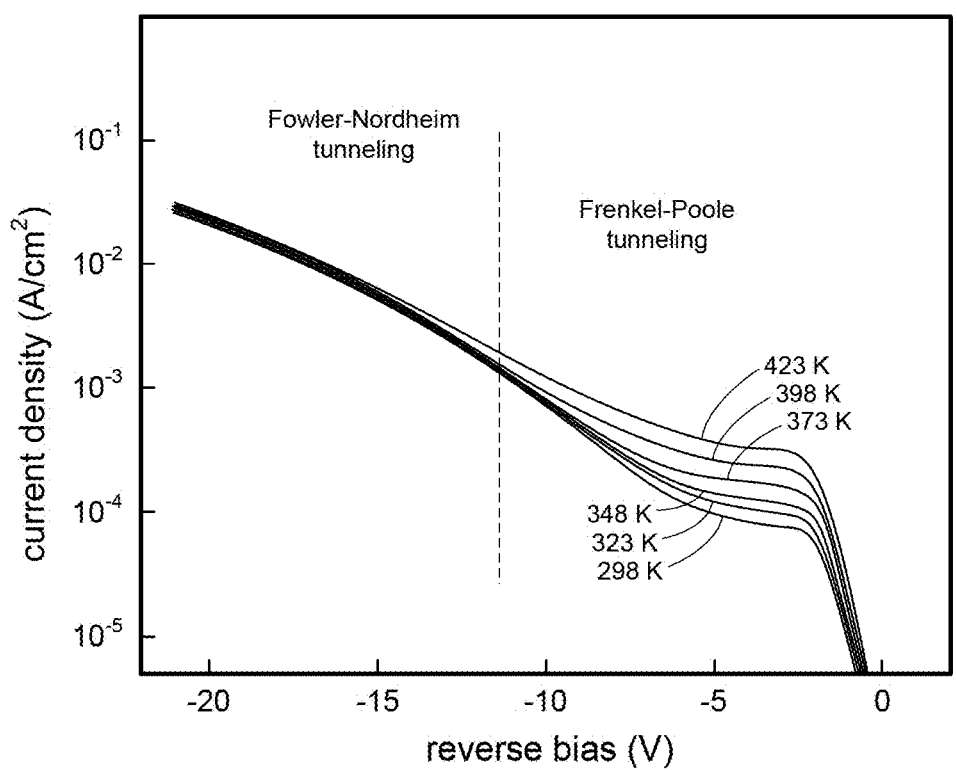
Figure 16A:
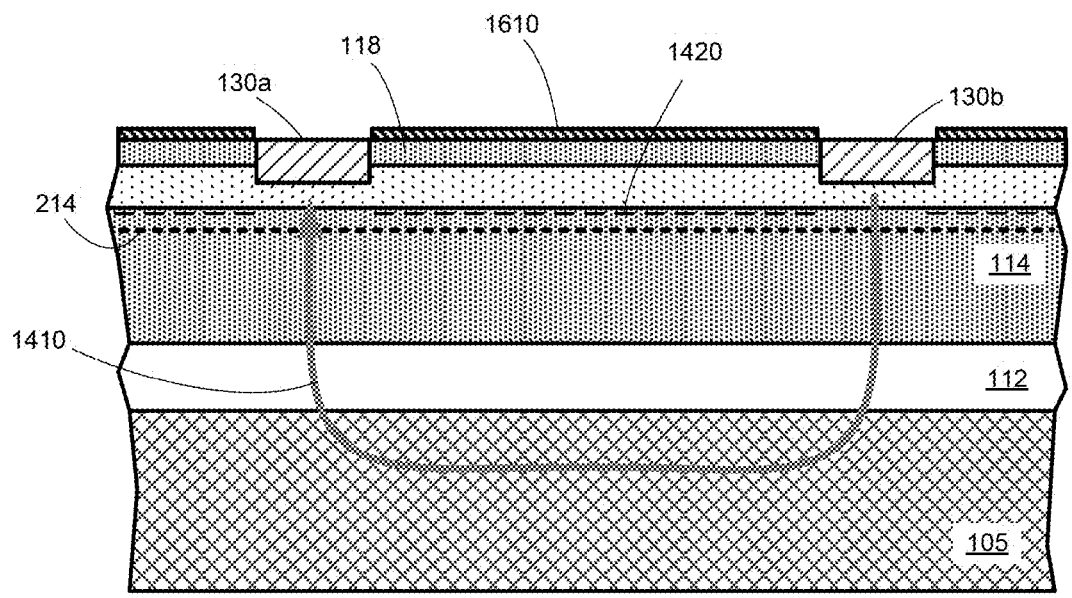
Figure 16B:
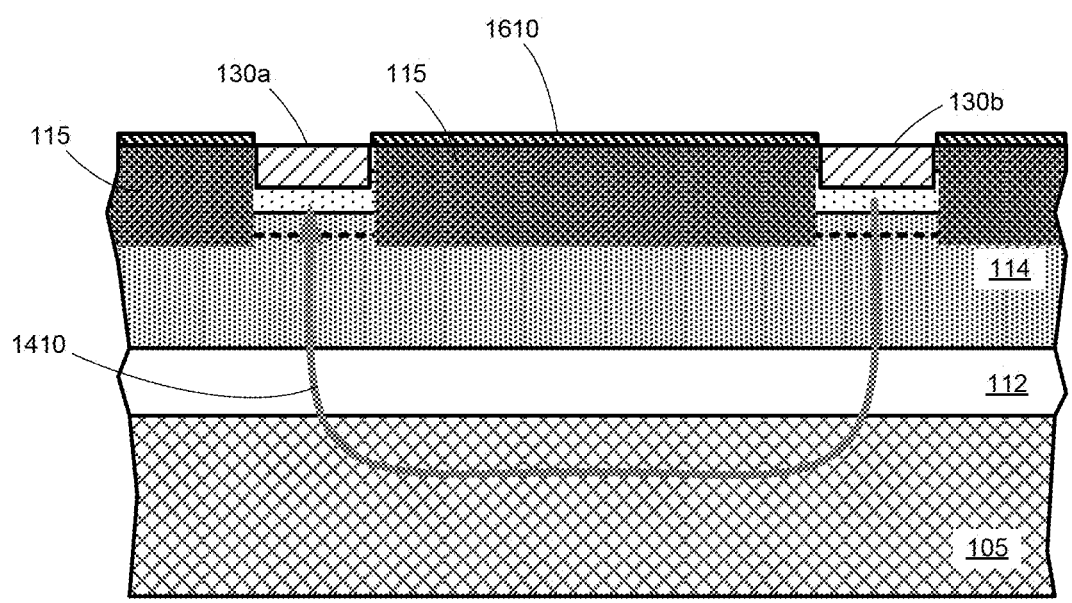
Figure 17:
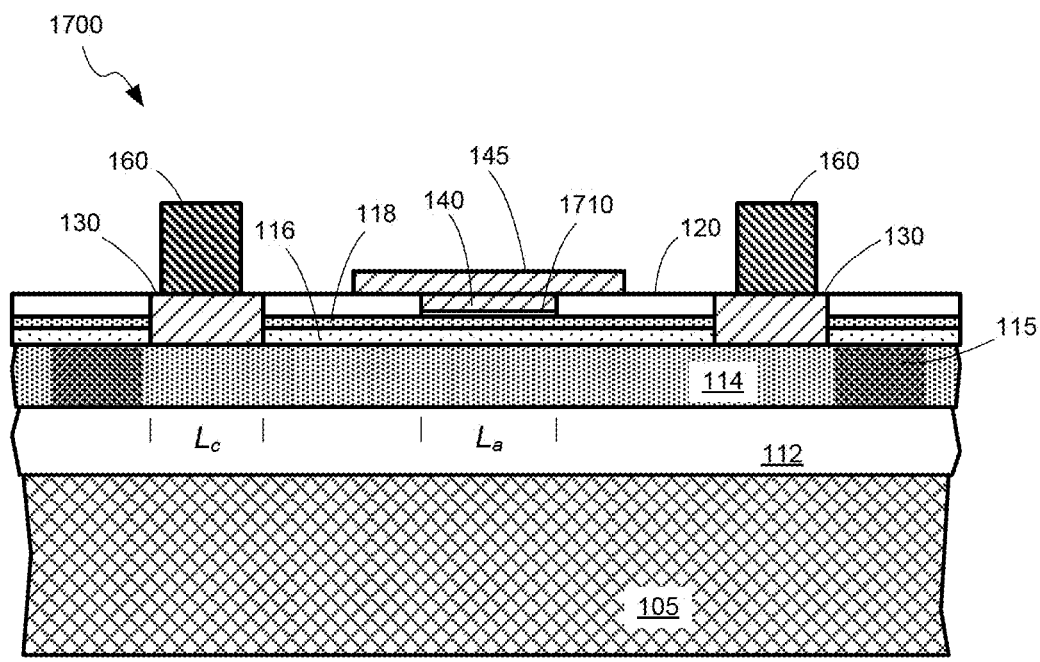
Figure 18:
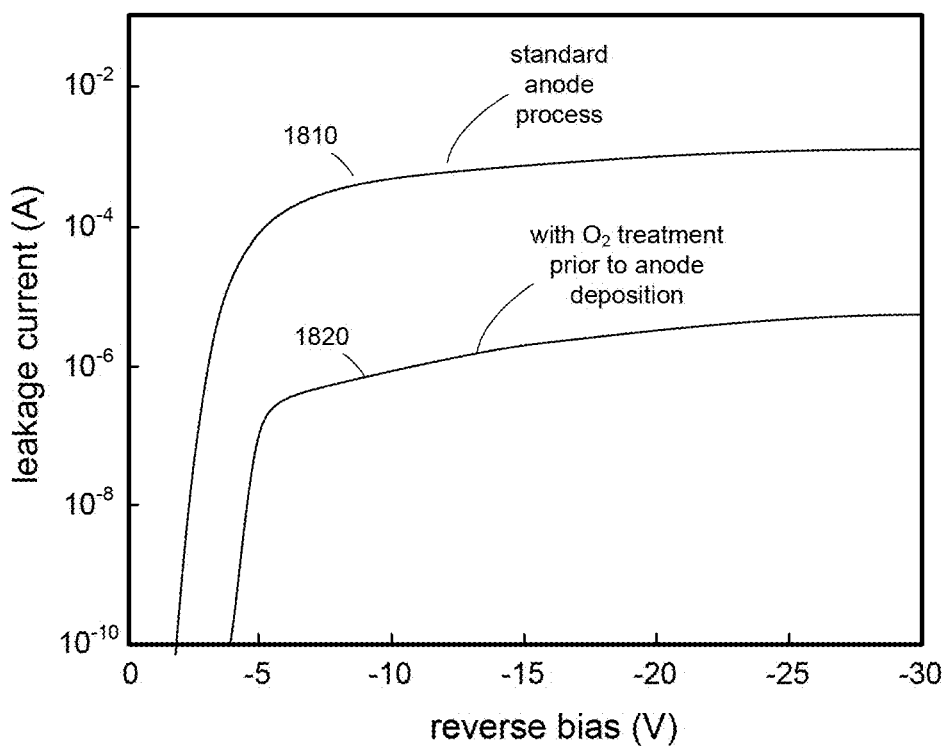
Figure 19:
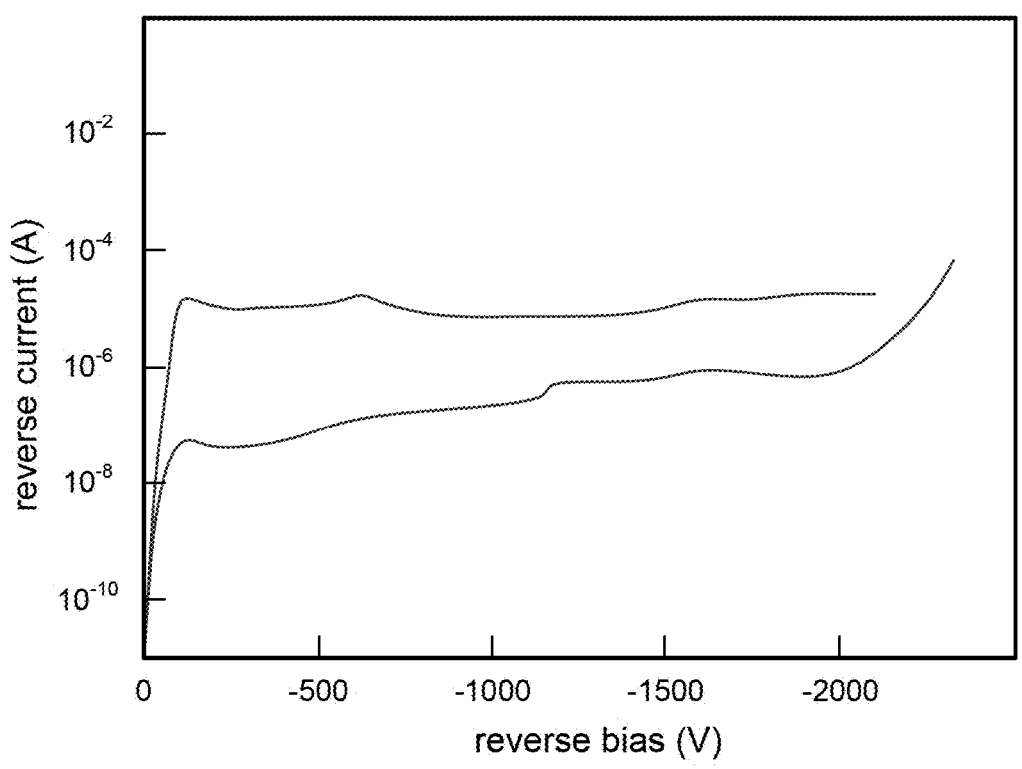

(location and direction indicated approximately by the dashed arrow) at two reverse-bias potentials, according to some embodiments;

FIG. 5 illustrates calculated electric field profiles along a GaN conduction layer for the structure depicted in FIG. 3 for two field-plate lengths at a reverse-bias potential of 500 volts, according to some embodiments;

FIG. 6A illustrates the value of the first electric field peak $E_1$ near the anode edge in the GaN conduction layer as a function of silicon nitride thickness for four different field-plate lengths;

FIG. 6B illustrates the value of the second electric field peak $E_2$ below the anode-connected field-plate edge in the GaN conduction layer as a function of silicon nitride thickness for four different field-plate lengths;

FIG. 7 depicts an elevation view of structure of a high-voltage Schottky diode having two anode-connected field plates, for which electric field simulations were carried out;

FIG. 8 illustrates calculated electric field profiles along a GaN conduction layer for the structure depicted in FIG. 7 (location and direction indicated approximately by the dashed arrow) at two reverse-bias potentials, according to some embodiments;

FIG. 9A illustrates the value of the first electric field peak $E_1$ near the anode edge in the GaN conduction layer for the structure depicted in FIG. 7 as a function of silicon nitride thickness for four different field-plate lengths;

FIG. 9B illustrates the value of the second electric field peak $E_2$ below the first field-plate edge in the GaN conduction layer for the structure depicted in FIG. 7 as a function of silicon nitride thickness for four different field-plate lengths;

FIG. 9C illustrates the value of the third electric field peak $E_3$ below the second field-plate edge in the GaN conduction layer for the structure depicted in FIG. 7 as a function of silicon nitride thickness for four different field-plate lengths;

FIG. 10 illustrates the effect of varying the distance between the first and second field-plate edges on breakdown voltage for two anode-to-cathode separations;

FIG. 11 depicts an elevation view of structure of a high-voltage Schottky diode having three anode-connected field plates, for which electric field simulations were carried out;

FIG. 12A illustrates calculated electric field profiles along a GaN conduction layer for the structure depicted in FIG. 11 (location and direction indicated by the dashed arrow) at four reverse-bias potentials where the third anode-connected field plate extends approximately 2.5 microns beyond the second anode-connected field plate;

FIG. 12B illustrates calculated electric field profiles along a GaN conduction layer for the structure depicted in FIG. 11 at four reverse-bias potentials where the third anode-connected field plate extends approximately 1 micron beyond the second anode-connected field plate;

FIG. 13-1A illustrates a multi-layer substrate on which a high-voltage Schottky diode may be formed;

FIG. 13-1B and FIG. 13-1C depict structures associated with acts for forming cathodes of a high-voltage Schottky diode, according to some embodiments;

FIG. 13-1D, FIG. 13-1E, FIG. 13-1F and FIG. 13-1G depict structures associated with acts for forming an anode and a first anode-connected field plate, according to some embodiments;

FIG. 13-1H depicts structure associated with deposition of a second insulating layer;

FIG. 13-1I, FIG. 13-1J and FIG. 13-1K depict structures associated with acts for forming a second anode-connected field plate, according to some embodiments;

FIG. 13-2A illustrates a multi-layer substrate on which a high-voltage Schottky diode may be formed;

FIG. 13-2B, FIG. 13-2C and FIG. 13-2D depict structures associated with acts for forming anode and cathode vias of a high-voltage Schottky diode, according to some embodiments; and FIG. 13-2E and FIG. 13-2F depict structures associated with acts for forming an anode, cathodes, and a first anode-connected field plate, according to some embodiments FIG. 14 depicts a semiconductor device structure and leakage current paths associated with a Schottky diode;

FIG. 15 illustrates leakage current characteristics for a test device structure;

FIG. 16A depicts passivation of surface states, according to some embodiments;

FIG. 16B depicts formation of isolation regions by ion implantation, according to some embodiments;

FIG. 17 depicts an elevation view of structure of a lateral, high-voltage Schottky diode comprising gallium-nitride material, according to some embodiments;

FIG. 18 depicts a reduction in leakage current due to oxygen plasma treatment of a gallium-nitride surface prior to forming an anode, according to some embodiments; and FIG. 19 shows measured reverse-bias characteristics of exemplary Schottky diodes fabricated according to the present embodiments.

Features and advantages of the illustrated embodiments will become more apparent from the detailed description set forth below when taken in conjunction with the drawings.

DETAILED DESCRIPTION

Microwave and radio frequency (RF) systems often include circuitry arranged to translate a frequency of a signal to a higher or lower frequency value. Frequency translation can occur in applications involving wireless transmission and receiving of signals. For example, data may be mixed onto a high-frequency carrier wave for transmission, and may later be down-converted at a receiver. Some applications may involve generation of a relatively low-frequency voltage or current that is proportional to an amplitude of a high-frequency (RF or microwave) signal. Often, Schottky diodes are used in such circuits. Some example circuits in which Schottky diodes may be used include, but are not limited to, single-ended mixers, balanced mixers, double-balanced mixers, double-double-balanced mixers, image-reject mixers, subharmonic mixers, image-recovery mixers, phase detectors, bridge-quad mixers, sampling circuits, frequency multipliers, quadrature-phase modulators, and single-sideband modulators and RF receivers.

Schottky diodes may also be used in power-conversion applications. For example, Schottky diodes may be used in various types of power converters, e.g., in power rectification and/or inversion circuitry. Schottky diodes may also be used for voltage clamping in power amplification circuits. In some cases, Schottky diodes may be used for signal sampling, pulse shaping, or fast logic gating. There are a wide variety of uses for Schottky diodes in signal processing, RF, microwave, and power electronics.

A Schottky diode may be characterized by several figures of merit. One figure of merit may be an amount of current the diode can handle when forward biased. Another figure of merit may be an amount of reverse-bias current leaked through the diode when the diode is reversed biased.

Another figure of merit may be a breakdown voltage of the diode. A breakdown voltage may be a maximum amount of reverse-bias voltage that the diode can withstand before avalanche breakdown and high current conduction occurs that can destroy the diode.

The inventors have recognized and appreciated that applications relating to power amplification and RF and microwave systems may benefit from Schottky diodes having very high breakdown voltages. The inventors have conceived and developed methods and structures for forming Shottky diodes with reverse-breakdown voltages that can exceed 2000 volts. Such diodes can be used, for example, in high-frequency power electronics and resist high-voltage transients that might otherwise damage the circuits.

An example high-voltage Schottky diode structure is depicted in FIG. 1A, according to some embodiments. A high-voltage Schottky diode 100 may be formed as a lateral diode structure, and include one or more anodes 140 having a length $L_a$ and one or more cathodes 130 having a length $L_c$ are formed on a same side of a substrate 105. A lateral diode structure has the benefit of not needing through-substrate vias for connecting to a cathode or anode of the device. This can make integration of the high-voltage diode into an integrated circuit (IC) an easier task. A high-voltage Schottky diode 100 may comprise a multi-layer structure that includes a substrate 105, a buffer layer 112, a conduction layer 114, a barrier layer 116, and at least one electrically insulating dielectric layer 120. Some embodiments may, or may not, include a semiconductor cap layer 118, which may be formed of a same material as the conduction layer 114.

A high-voltage Schottky diode 100 may further include at least one anode-connected field plate 145, for each anode 140, and may include cathode contacts 160. Edges of the anode 140 and a nearest edge of the cathode or cathodes 130 may be separated by an anode-to-cathode distance $L_1$. Outer edges 146 of the anode-connected field plate 145 may extend beyond outer edges of the underlying anode 140 by a distance $L_2$. Electrical isolation regions 115 may be formed around one or more Schottky diodes. In some implementations, an insulating passivation layer (not shown) may be formed over the anode-connected field plate and cathode contacts.

Some implementations may include additional layers (not shown) within the multi-layer structure. For example, there may be one or more layers between the substrate 105 and conduction layer 114. These layers may include any combination of the following layers: amorphous dielectric (e.g., silicon nitride, oxide) layer(s) compositionally graded layer(s), and strain-relieving layer(s). Such layers may be included to ameliorate stresses arising from deposition of dissimilar materials and/or to improve electrical performance of the device (e.g., reduce parasitic capacitance or leakage currents).

In a plan view, a high-voltage Schottky diode 100 may be arranged as depicted in FIG. 1B or FIG. 1C. The anodes and cathodes may have extended widths in one direction and run parallel to each other, according to some embodiments. In some embodiments, a high-voltage Schottky diode may include conductive leads 174, 172 (e.g., patterned during a metallization level) that extend between one or more anode-connected field plates 145 and one or more anode contact pads 184, and between one or more cathode contacts 160 and one or more cathode contact pads 182. The contact pads may be significantly larger than depicted in the drawing, and may be significantly larger than the anode-connected field plates or cathode contacts. In some embodiments, the anode-connected field plates 145, conductive leads 174, and anode contact pads 184 may be formed from a same metallization level. In some embodiments, the cathode contacts 160, conductive leads 172, and cathode contact pads 182 may be formed from a same metallization level, which may be the same as or different from the metallization level used to form the anode-connected field plates, conductive leads 174, and anode contact pads.

In some embodiments, the anode 140, cathodes 130, and anode-connected field plate material 145 may be formed from different material compositions. For example, a cathode may comprise a multi-layer structure such as, but not limited to, Ti/Al/Ni/Au, Ti/Al/W, or Ta/Al/Ta. The anode may comprise, but is not limited to, Ni/Pd/Au/Ti, Ni/Pt/Au/Ti, Ni/Ti/Al/W, Ni/W/Al/W, W/Al/W, Ni/Wn/Al/W, WN/Al/W, or Pt/Au/Ti compositions. An anode-connected field plate may comprise, but not be limited to, Ti/Pt/Au, Al/Cu, or TiN/Cu compositions.

Figure 2:
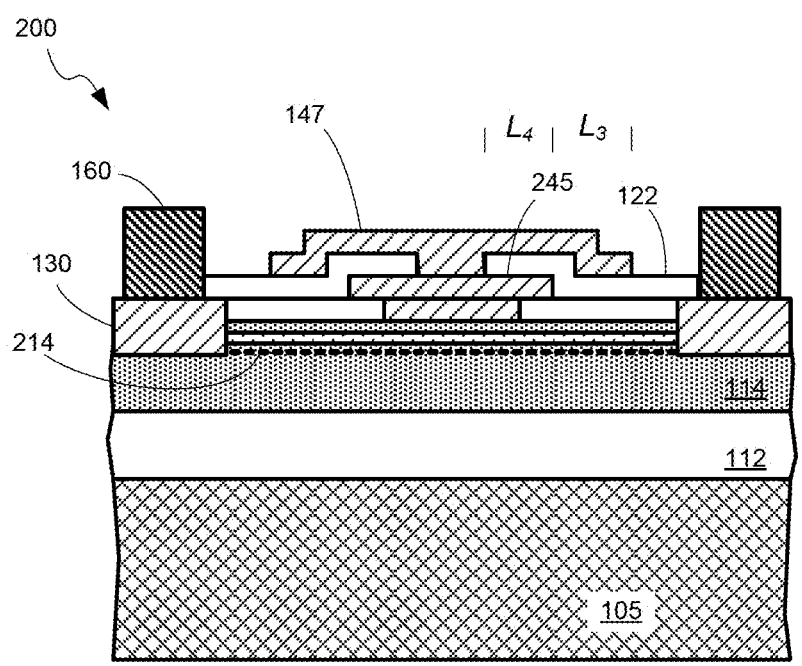
FIG. 2 depicts an elevation view of structure of a high-voltage Schottky diode having two anode-connected field plates, according to some embodiments.

FIG. 2 depicts an alternative embodiment of a high-voltage Schottky diode. Elements that are common with the embodiment depicted in FIG. 1A are identified with same reference numbers. The device depicted in FIG. 2 comprises a multi-field-plate Schottky diode 200, and includes a second anode-connected field plate 147 formed above the first anode-connected field plate 145. The second anode-connected field plate 147 is arranged to electrically contact the first anode-connected field plate at a central region of the first anode-connected field plate, and to be spaced from the first anode-connected field plate by a second insulating layer 122 over a peripheral region 245 of the first anode-connected field plate 145. The peripheral region may extend from an outer edge of the first anode-connected field plate toward its center by a distance $L_4$. The second anode-connected field plate 147 may further extend a distance $L_3$ beyond an outer edge of the first anode-connected field plate 145 toward the cathode or cathodes 130.

Dimensions for components of a high-voltage Schottky diode, for either of the embodiments depicted in FIG. 1A and FIG. 2, may be as follows. The anode lengths $L_a$ may be between approximately 2 microns and approximately 20 microns. The cathode lengths $L_c$ may be between approximately 2 microns and approximately 20 microns. The widths of the anodes $W_a$ and cathodes may be between approximately 100 microns and approximately 1000 microns, though larger and smaller widths may be used in some cases. The anodes 140 may be spaced approximately midway between cathodes 130. A shortest distance $L_1$ between anodes 140 and cathodes 130 may be between approximately 5 microns and approximately 50 microns, according to some embodiments. In some cases, $L_1$ may be between about 5 microns and about 25 microns. In yet other embodiments, $L_1$ may be between about 5 microns and about 15 microns.

In further detail, a high-voltage Schottky diode may be formed on any suitable substrate 105. Example substrates include, but are not limited to, silicon (Si), silicon carbide (SiC), gallium nitride (GaN), and sapphire. According to some embodiments, the substrate 105 may comprise bulk monocrystalline silicon. In some instances, the substrate may comprise a semiconductor on insulator (SOI) substrate where the semiconductor is any of the foregoing mentioned semiconductor substrate materials. The substrate 105 may be in the form of a wafer (e.g., a Si semiconductor wafer) and have a diameter between approximately 50 mm and approximately 450 mm In various embodiments, the surface of the substrate is monocrystalline, so that a III-nitride (e.g., GaN, AlN, AlGaN, InGaN) or any other suitable crystalline III-V, II-VI, tertiary, or quarternary material may be epitaxially grown from the surface of the substrate.

Because there may be a lattice mismatch between the substrate 105 and the conduction layer 114, one or more transitional layers may be formed on the substrate as buffer layer 112 to ameliorate stress that would otherwise develop from the lattice mismatch. The transitional layers may be formed by epitaxial growth, according to some embodiments. For example, any of the transitional layers may be formed using a chemical vapor deposition (CVD) process or atomic layer deposition (ALD) process. A CVD process may include, but not be limited to, a metal-organic chemical vapor deposition (MOCVD) process. Other deposition processes may include hydride vapor phase epitaxy (HYPE) or molecular beam epitaxy (MBE). The transitional layers may include at least a first transitional layer (e.g., AlN) deposited directly on the substrate 105 followed by one or more gallium-nitride material layers deposited on the first transitional layer. Examples of transitional layers 112 are described in, for example, U.S. Pat. Nos. 7,135,720 and 9,064,775, which are both incorporated herein by reference in their entirety. Some of the transitional layers may be compositionally graded. A total thickness of the buffer layer may be between approximately 0.5 micron and approximately 4 microns.

As used herein, the phrase "gallium-nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_{x-}In_yGa_{(1-x-y)}N$), gallium arsenide phosporide nitride ($GaAs_xP_y N_{(1-X-y)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials may be doped n-type or p-type, or may be undoped. Suitable gallium-nitride materials are described in U.S. Pat. No. 6,649,287, which is incorporated herein by reference in its entirety.

According to some embodiments, the conduction layer 114 may comprise gallium nitride (GaN) or any suitable gallium-nitride material. The conduction layer 114 may be formed by epitaxial growth (e.g., by an MOCVD process), and may be deposited directly on or above the buffer layer 112. A thickness of the conduction layer may be between approximately 0.5 micron and approximately 4 microns. In some embodiments, the conduction layer may be lightly doped (for either n or p type conductivity) or may be undoped.

The inventors have found that it is desirable to have a combined thickness of the buffer layer 112 and conduction layer 114 to be at least 4.5 microns, in some embodiments. This can avoid limiting the device's lateral breakdown by the vertical epitaxial profile. In some cases, the combined thickness of the buffer layer and conduction layer is at least 4.0 microns to avoid limiting the device's lateral breakdown by the vertical epitaxial profile.

A barrier layer 116 may be formed using any suitable epitaxial growth process, and may be deposited directly on or above the conduction layer 114, in some embodiments. A thickness of the barrier layer 116 may be between approximately 10 nanometers and approximately 50 nanometers, though other thicknesses may be used in some cases. According to some embodiments, the barrier layer 116 may comprise any suitable gallium-nitride material material. The barrier layer may be doped for either n or p type conductivity, or may be undoped. The barrier layer 116 and conduction layer 114 may form a heterojunction, and thereby create a two-dimensional electron gas (2DEG) in the conduction layer 114 adjacent to the interface between the conduction layer and barrier layer. The 2DEG 214 (depicted in FIG. 2) may provide a highly conductive path for current flowing between the anode 140 and cathodes 130.

When using the terms "on," "adjacent," or "over" in to describe the locations of layers or structures, there may or may not be one or more layers of material between the described layer and an underlying layer that the layer is described as being on, adjacent to, or over. When a layer is described as being "directly" or "immediately" on, adjacent to, or over another layer, no intervening layer is present. When a layer is described as being "on" or "over" another layer or substrate, it may cover the entire layer or substrate, or a portion of the layer or substrate. The terms "on" and "over" are used for ease of explanation relative to the illustrations, and are not intended as absolute directional references. A device may be manufactured and/or implemented in other orientations than shown in the drawing (for example, rotated about a horizontal axis by more than 90 degrees.

According to some embodiments, the conduction layer 114 comprises undoped gallium nitride (GaN), and the barrier layer comprises undoped aluminum-gallium nitride (AlGaN) having an Al percentage (by mole fraction) between approximately 20% and approximately 40%.

Some embodiments may include a semiconductor cap layer 118 formed over the barrier layer 116. The semiconductor cap layer may comprise a semiconductor material of the same type as the conduction layer 114. The cap layer 118 may or may not be doped. In some implementations, the cap layer may comprise a layer of undoped or doped GaN. The cap layer 118 may have a thickness between approximately 1 nm and approximately 10 nm. The cap layer may be formed by any suitable epitaxial deposition process (e.g., by ALD or CVD). Some implementations may not include a cap layer 118.

The conduction layer 114, barrier layer 116, and cap layer 118 may have low defect densities that are typical for integrated-circuit-grade semiconductor material. For example the defect density for each layer may be less than approximately $10^9$ cm$^{-2}$ in some implementations, and less than approximately $10^8$ cm$^{-2}$ in some embodiments. Defect densities may be higher in the buffer layer 112 or in portions of the buffer layer.

Any suitable insulating layer 120 may be used to electrically insulate one or more anode-connected field plates from the barrier layer 116 or cap layer 118. Example insulator materials include, but are not limited to silicon nitride, silicon oxide, hafnium oxide, aluminum oxide, lanthanum oxide, titanium oxide, zinc oxide, zirconium oxide, gallium oxide, scandium oxide, aluminum nitride, and hafnium nitride. An insulating layer may be formed by any suitable deposition process, such as chemical vapor deposition, plasma-enhanced chemical vapor deposition, atomic layer deposition, or electron-beam evaporation. Other deposition processes may be used in other embodiments.

Anodes 140, cathodes 130, anode-connected field plates 145, 147, and cathode contacts 160 may be formed from a metal, a metal silicide, metal alloys, a plurality of metal layers, or a highly-doped amorphous semiconductor. In some implementations, any of the anodes, cathodes, anode-connected field plates, and cathode contacts may comprise one or more layers of the following metals and/or metal alloys in any suitable combination: titanium, nickel, chromium, platinum, palladium, osmium, aluminum, gold, tungsten, rhenium, tantalum, and alloys of titanium and tungsten. In some cases, one or more of the following silicides may be used: platinum silicide, tungsten silicide, nickel silicide, cobalt silicide, titanium silicide, molybdenum silicide, and tantalum silicide. Any of the anode, cathode, and field-plate elements may be formed by a physical deposition process (e.g., electron-beam deposition or sputtering or plating). A thickness of a cathode or anode may be between approximately 20 nm and approximately 200 nm, though other thicknesses may be used in some cases. A thickness of an anode-connected field plate 145, 147 may be between approximately 200 nm and approximately 1.5 microns. A thickness of a cathode contact 160 may be between approximately 200 nm and approximately 2 microns.

Although only one or few Schottky diode structures are depicted in the drawings, many Schottky diode structures may be fabricated in parallel on a substrate 105. For example, the substrate 105 may comprise a semiconductor wafer and hundreds, thousands, or millions of the described Schottky diode structures may be fabricated on the semiconductor wafer. Some diodes may comprise multiple anodes and cathodes connected together, as depicted in FIG. 1C, so that larger currents can be handled by a diode.

In some implementations, isolation regions 115 may be formed around one or more Schottky diodes to prevent inflow or outflow of current to or from a diode to an adjacent circuit element. Isolation regions may comprise shallow trench isolation structures (e.g., trenches filled with an oxide or other insulator), in some cases, or may comprise regions of damaged crystalline semiconductor in other embodiments. The inventors have recognized and appreciated that effective isolation regions may be formed in gallium-nitride materials by damaging the crystal lattice structure with ion implantation (e.g., implanting nitrogen, argon, boron, or phosphorus). In some embodiments, an isolation region may be formed around one or more Schottky diodes by implanting a peripheral region with nitrogen at multiple different energies. The different implantation energies are used to extend the damaged region around the diode from the top of the barrier layer 116 (or cap layer if present) to a depth of at least 100 nm. Forming isolation regions 115 by ion implantation can be easier than process steps associated with forming a field oxide around the diodes.

The inventors have recognized and appreciated that structure relating to the anode-connected field plates 145, 147, insulating layers 120, 122, anode-cathode spacing $L_1$, and location of field-plate edges can critically determine a reverse-bias breakdown voltage for the described Schottky diodes. To illustrate, several numerical simulations were carried out to calculate the magnitude of electric fields in different Schottky diode structures. The structures and results from the simulations are described in connection with FIG. 3 through FIG. 12B.

FIG. 3 depicts a Schottky diode structure 300 having a single anode-connected field plate 145 that served as a device model for a first set of numerical simulations to evaluate electric fields within the device under various bias conditions. The structure used in the simulations comprised a top portion of a Schottky diode, and included a GaN conduction layer 114, an AlGaN barrier layer 116, an anode 140, two cathodes 130, and an anode-connected field plate 145.

A first insulation layer 120 (silicon nitride) was included above the AlGaN barrier layer, and a passivation layer 150 (silicon nitride) was included over the device. For the simulations, a surface-state donor density at the interface of the AlGaN barrier layer 116 and the GaN conduction layer was $5\times10^{12}/cm^2$. This surface-state density was found to produce a 2DEG in the GaN conduction layer and provide diode-like current-voltage device characteristics. The length of the anode $L_a$ was 10 microns and the distance $L_1$ from the anode edge to cathode edge was 10 microns. In the simulations, the distance $L_2$ by which the field plate edge extended beyond the anode was varied.

Figure 4:
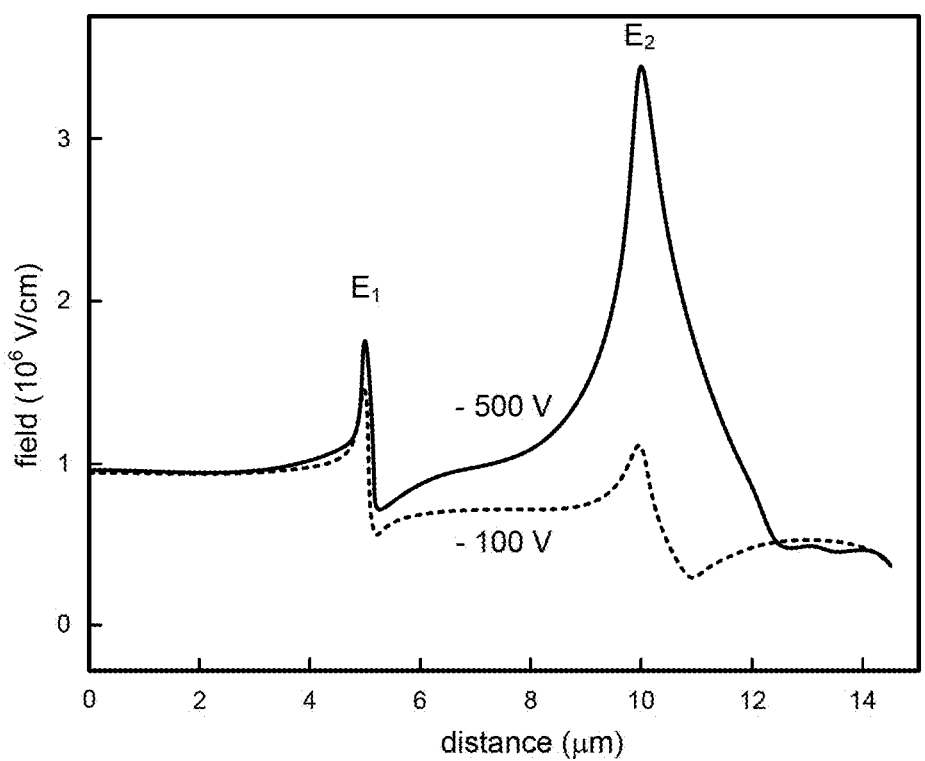
FIG. 4 illustrates calculated electric field profiles along a GaN conduction layer for the structure depicted in FIG. 3

In a first set of simulations, the magnitude of the electric field in the gallium nitride conduction layer was calculated as a function of distance from a center of the anode toward the cathode. For these simulations, $L_2$ was approximately 5 microns. In a first case, a bias of −100 V (a reverse bias) was applied between the anode and the cathode. In a second case, a bias of −500 V was applied between the anode and the cathode. Plots of the electric field for each case are shown in FIG. 4. The plots illustrate the electric field values along the dashed arrow of FIG. 3, and are plotted for one side of the symmetric diode structure. Each plot shows a first peak in the electric field $E_1$ that appears below the edge of the anode, depicted as region 310 in the conduction layer 114. A second peak $E_2$ appears in the electric field below the edge of the anode-connected field plate 145, depicted as region 320. Other reverse bias potentials were also trialed. For these simulations, it was observed that the first peak $E_1$ tends to saturate with increasing reverse bias to a value below $2\times10^6$ V/cm. The second peak $E_2$ that appears below the outer edge of the field plate 145 increases in value to over $3\times10^6$ V/cm. Since the conduction layer comprises GaN with an intrinsic field strength of $5\times10^6$ V/cm, the reverse bias potential may be increased further (as much as 800 V or higher) before breakdown is observed.

The anode-connected field plate 145 spreads the electric field in the conduction layer, and helps suppress the first electric field peak $E_1$ that forms at the edge of the anode. Without the anode-connected field plate 145, the first electric field peak $E_1$ would rise to a breakdown value well before a reverse bias of 800 V.

A second set of simulations were carried out to investigate different anode-connected field plate lengths. The results from these simulations are shown in FIG. 5. For these simulations, a bias of −500 V was applied between the anode and cathode. In these simulations, the extension length $L_2$ of the anode-connected field plate was changed from 1 μm to 7.5 μm. In the first simulation, shown as the dotted line, the outer edge of the anode-connected field plate was located about 1 μm beyond the outer edge of the anode. For this case, the first peak $E_1$ in the electric field was just below $3\times10^6$ V/cm, and the second peak $E_2$ exceeded $3\times10^6$ V/cm. Other extension lengths $L_2$ trialed included 2.5 μm, 5 μm, and 7.5 μm. It was found that increasing the extension length of the anode-connected field plate has little effect on the magnitude of the second electric field peak $E_2$. For example, in the fourth trial, shown as the solid line, the field-plate extension length was 7.5 μm, and although the value of the first electric field peak reduced, the second electric field peak $E_2$ remained at approximately the same value, just over $3 \times 10^6$ V/cm.

Additional simulations were carried out to observe changes in the magnitudes of the electric field peaks $E_1$ and $E_2$ due to varying the thickness $t_1$ of the insulating layer 120. Additionally, field-plate extension lengths $L_2$ were also varied in the simulations. For these simulations, the length of the anode was 10 μm, and a distance from the anode to the cathode was also 10 μm. Also a bias of −500 V was applied between the anode and cathode. The insulating layer 120 comprised silicon nitride. The observed changes in electric field peaks are plotted in FIG. 6A and FIG. 6B.

In FIG. 6A the value of the first electric field peak $E_1$ is plotted as a function of insulating layer thickness $t_1$ for four different field-plate extension lengths $L_2$. A first trace 610 was observed for a field-plate extension length of 0.5 μm. A second trace 620 corresponds to a field-plate extension length of 1 μm. The third trace 630 and forth trace 640 correspond to field-plate extension lengths of 2.5 μm and 7.5 μm respectively. As can be observed, the magnitude of the first electric field peak $E_1$ decreases with decreasing thickness in the insulating layer 120. Additionally, the magnitude of the first electric field peak $E_1$ decreases with increasing length of the field-plate extension length $L_2$.

FIG. 6B illustrates plots of the second electric field peak $E_2$ as a function of insulating layer thickness $t_1$ for the same field-plate extension lengths that were trialed for the graph of FIG. 6A. In terms of the second peak $E_2$, the extension length $L_2$ of the field plate has little effect on the value of the second electric field peak. This result is consistent with the results shown in FIG. 5. Additionally, the value of the second electric field peak $E_2$ decreases with increasing thickness $t_1$ of the insulating layer 120. This is an opposite trend from that observed in FIG. 6A. These results suggest that an insulating layer thickness for a single field-plate design is preferably in a range between about 100 nm and about 300 nm. The results also indicate that is beneficial to have the first anode-connected field plate 145 extend beyond the outer anode edge by at least one micron.

A second set of simulations were carried out to calculate the electric field values in the gallium-nitride conduction layer for a two field-plate design depicted in FIG. 7. The structure 700 included a second anode-connected field plate 147 electrically connected to a first anode-connected field plate 145. The second anode-connected field plate extended farther toward the cathode than the first anode-connected field plate by a distance $L_3$. The second anode-connected field plate may be formed above and in electrical contact with the first anode-connected field plate. For this design, a second insulating layer 122 overlies the first anode-connected field plate and cathodes, and portions of the second anode-connected field plate are located above the second insulating layer 122. A passivation layer 150 was included over the device, and the surface-state density was $5 \times 10^{12}$/cm$^2$. The length of the anode was 10 μm, and the distance from the anode edge to the cathode edge was also 10 μm. For the simulations, a thickness of the first insulating layer 120 was fixed at 50 nm. The extension length $L_2$ of the first field plate 145 was fixed at 2.5 μm.

Electric field values along the gallium-nitride conduction layer were calculated for different reverse bias potentials, of which two are shown in FIG. 8. The extension length $L_3$ of the second field plate was fixed at 2.5 μm for the results shown in FIG. 8. In a first trial the applied bias was −100 V and the value of the electric field along the gallium-nitride conduction layer 114 is shown as the dashed line 810. In a second trial, the applied bias was −500 V and is shown as the solid trace 820. In each case, three peaks in the electric field were observed in the gallium-nitride conduction layer between the anode center and the cathode edge. The first peak $E_1$ corresponds to an outer edge of the anode, located at approximately 5 μm in the simulated structure 700. The second peak $E_2$ appears below the outer edge of the first anode-connected field plate 145. A third peak $E_3$ appears below the outer edge of the second anode-connected field plate 147, depicted as region 330 in the conduction layer 114. Similar to the single field-plate design, the value of the first electric field peak $E_1$ saturates with increasing reverse bias potential. For this simulated structure, the value of the first electric field peak $E_1$ reaches about $1.4 \times 10^6$ V/cm. The values of the second and third electric field peaks, however, increase with increasing reverse bias voltage. For the simulated structure, the values of the second and third electric field peaks reach about $2.2 \times 10^6$ V/cm at a reverse bias of about 500 V. Adding a second anode-connected field plate 147 reduces the value of the peak electric fields beyond the edge of the anode, as can be seen by comparing the plots of FIG. 8 with those of FIG. 4.

In additional simulations, the extension length $L_3$ of the second field plate was varied between the following values: 0.5, 1.0, 2.5, and 5.0 μm. Results from these simulations were similar to those shown in FIG. 5, but with an additional electric field peak $E_3$.

Simulations were also carried out to observe changes in the peak electric fields $E_1$, $E_2$, and $E_3$ caused by changing the thickness $t_2$ of the second insulating layer 122. The results from these simulations are shown in FIG. 9A through FIG. 9C. In FIG. 9A the value of the first electric field peak $E_1$ is plotted as a function of total insulator thickness. The total insulator thickness comprises the fixed thickness of the first insulating layer 120 ($t_1$=50 nm) and the thickness $t_2$ of the second insulating layer 122, which was varied for each case. Four field-plate extension lengths $L_3$ for the second anode-connected field plate 147 were trialed. As can be seen from the plots of FIG. 9A, changes in thickness $t_2$ of the second insulating layer 122 and changes in extension length $L_3$ of the second anode-connected field plate have little effect on the magnitude of the first electric field peak $E_1$.

FIG. 9B, however, shows that changes in insulator thickness $t_2$ and changes in extension length $L_3$ change the value of the second electric field peak $E_2$. For the simulated structure 700, increasing the field-plate extension length decreases the value of the second electric field peak, as does decreasing the thickness of the second insulating layer 122. The first trace 910 corresponds to a field-plate extension length $L_3$ of 0.5 μm. The second trace 920 corresponds to a field-plate extension length of 1 μm. The third trace 930 and fourth trace 940 correspond to a field-plate extension length of 2.5 μm and 5 μm, respectively.

The value of the third electric field peak $E_3$ is plotted in FIG. 9C as a function of the total insulator thickness ($t_1+t_2$) for the same for field-plate extension lengths used in FIG. 9A and FIG. 9B. As can be seen, increasing the field-plate extension length has little effect on the value of the third electric field peak $E_3$. However, increasing the thickness $t_2$ of the second insulating layer decreases the value of the third electric field peak, which is an opposite trend from that observed in FIG. 9B. Because the value of the second electric field peak $E_2$ remains below a breakdown field strength for gallium nitride at larger thicknesses of the second insulating layer 122, it may be preferable to use a thicker insulating layer for the second insulating layer to keep the second and third electric field peak values in the gallium-nitride conduction layer below a breakdown field strength. For example, the second insulating layer 122 may have a thickness $t_2$ between approximately 400 nm and approximately 600 nm, according to some embodiments.

Based upon the simulation results, a number of high-voltage Schottky diodes were fabricated according to structure shown in FIG. 7. The diodes included two anode-connected field plates formed above and anode. An extension length $L_2$ of the first anode-connected field plate was 2.5 µm. The distance $L_1$ from the anode edge to the cathode edge for a first group of diodes was approximately 10 µm, and for a second group of diodes was approximately 15 µm. Reverse bias potentials were applied to the devices until the devices exhibited breakdown. An extension length of the second anode-connected field plate 147 was varied across diodes within each group.

Results from the breakdown tests are plotted in FIG. 10. The breakdown voltage $V_b$ observed for the tested devices is plotted as a function of the extension length $L_3$ of the second anode-connected field plate 147. The results show that a significant improvement in breakdown voltage is achieved when the extension length $L_3$ is increased from about 0.5 µm to about 1.5 µm. At about 1.5 µm, breakdown voltages of more than 1000 V and as much as 1200 V reverse bias were observed for some diodes. Increasing the extension length $L_3$ further resulted in a reduction of reverse bias breakdown voltage. For highest breakdown voltages for the tested structure (e.g., in excess of 900 volts reverse bias), there exists a critical range of field-plate extension lengths $L_3$ for the second anode-connected field plate. In this case, the range is between approximately 1.25 µm and approximately 2.5 µm. The range of lengths may be increased for lower breakdown voltages. For example, in some cases $L_3$ may be between approximately 1 µm and approximately 3 µm, or in some instances between approximately 1 µm and approximately 4 µm for breakdown voltages between about 700 V and about 1200 V reverse bias.

In some implementations, it may be beneficial to have the extension length $L_3$ of the second anode-connected field plate 147 less than an extension length $L_2$ of the first anode-connected field plate 145. According to some embodiments, the outer edge of the anode, first anode-connected field plate 145, and second anode-connected field plate 147 may lie along a curve 710 (referring to FIG. 7) that bends away from the surface of the substrate, e.g., bends away from the barrier layer 116.

Some minor differences were observed between the two different anode-to-cathode distances $L_1$. A highest breakdown voltage is observed for the larger anode-to-cathode spacing (15 µm) when the extension length $L_3$ of the second anode-connected field plate is within the critical range. However, higher breakdown voltages were observed for the smaller anode-to-cathode spacing at other extension length values.

High-voltage Schottky diodes having three anode-connected field plates have also been contemplated by the inventors. An example high-voltage diode structure 1100 is depicted in FIG. 11. Numerical simulations were also carried out for this structure to evaluate the electric field in the gallium-nitride conduction layer 114. For these simulations, the anode length $L_a$ was 10 µm, and the anode-to-cathode spacing $L_1$ was 10 µm. The extension length $L_2$ of the first anode-connected field plate 145 was 2.5 µm, and the extension length $L_3$ of the second anode-connected field plate 147 was 2.5 µm. The thickness $t_1$ of the first insulating layer 120 was 50 nm, and the thickness $t_2$ of the second insulating layer 122 was 450 nm. The thickness $t_3$ of the third insulating layer 124 was set at 500 nm for the simulations. In a first set of simulations, electric field values along the gallium-nitride conduction layer were calculated for a third field-plate extension length $L_5$ of 2.5 µm, and are plotted in FIG. 12A for four different reverse bias potentials. The values of the peak electric fields $E_1$, $E_2$, $E_3$, and $E_4$ in the corresponding regions 310, 320, 330, and 340 of the conduction layer 114 can be observed from the plots. For this structure, the outer edge of the third anode-connected field plate 149 is close to the cathode, and at high reverse bias the electric field increases significantly near the cathode.

In a second set of simulations, the electric fields in the conduction layer were calculated for a third extension length $L_5$ of 1 µm. By allowing more spacing between an outer edge of the third anode-connected field plate 149 and the inner edge of the cathode, the electric field near the cathode reduces. This can be seen from the curves of FIG. 12B. The electric field values shown in FIG. 12B indicate that it is possible to keep the electric field in the gallium-nitride conduction layer well below its intrinsic breakdown value of $5 \times 10^6$ V/cm at an applied potential of $-1500$ V. This indicates that the device may be capable of withstanding reverse bias voltages as much as 2000 V. Reverse bias voltages up to 1500 V may be applied for long periods of time (e.g., longer than one second), since the electric field is well below the intrinsic field strength. In some embodiments, an outer edge of any of the anode-connected field plates should be spaced horizontally from the cathode by at least 3 microns.

Simulations were also carried out to observe the effect of increasing a distance between the anode and cathode for the diode. In the simulation, the distance $L_1$ was increased by 50% to a value of 15 µm. However, this increase in anode-to-cathode distance had little effect on the peak values of the electric fields $E_1$, $E_2$, $E_3$, and $E_4$. The largest effect of increasing the anode-to-cathode spacing appeared as a reduction in the electric field value near the cathode to a value less than $1 \times 10^6$ V/cm at the four reverse bias potentials.

According to some embodiments, microfabrication techniques for forming anode-connected field plates may be performed without planarization of the substrate after depositions of the anode and first anode connected field plate, insulating layers, and subsequent anode-connected field plates. Avoiding planarization steps can reduce the time and cost of device fabrication. In some cases, planarization steps (e.g., chemical-mechanical polishing) may be used after some or all depositions of the anode-connected field plates and insulating layers.

Example fabrication techniques of the high-voltage Schottky diode will now be described. Referring to FIG. 13-1A, a wafer may be prepared or obtained that includes a multi-layer stack for a high-voltage Schottky diode. For example, the wafer may comprise substrate 105, a buffer layer 112, a gallium-nitride conduction layer 114, a barrier layer 116, and a cap layer 118. The buffer layer 112, gallium-nitride conduction layer 114, barrier layer 116, and cap layer 118 may be epitaxially grown on the substrate or deposited by any suitable process. According to some implementations, an insulating layer 120 (for example, a silicon nitride layer) may be deposited over the multi-layer stack using any suitable deposition process.

A photoresist 1310 may be patterned over the insulating layer 120, as depicted in FIG. 13-1B. The photoresist may be patterned to open cathode vias 1320 by any suitable photolithography method, such as projection photolithography. Subsequently the insulating layer 120, cap layer 118, barrier layer 116, and possibly a portion of the conduction layer 114 may be etched anisotropically (e.g., using reactive ion etching) to expose the conduction layer. In some embodiments, the etch may stop at or part way into the barrier layer. In some implementations, the etch may continue into the conduction layer 114, as depicted. A conductor 1330 (e.g., any suitable cathode composition described above) may be deposited over the substrate, as depicted in FIG. 13-1C. The first resist layer 1310 and excess conductor 1330 over the resist may be removed from the substrate in a lift-off process. The lift-off will leave cathodes 130 on the substrate, as depicted in FIG. 13-1D.

A second layer of resist 1340 may be deposited and patterned to open a via 1342 for patterning the anode. The insulating layer 120 may then be etched anisotropically to form an anode via 1346 and expose the cap layer 118 (or barrier layer 116 if the cap layer is not used). The second layer of resist 1340 may be stripped from the wafer, and a third layer of resist 1350 deposited, as depicted in FIG. 13-1E. A via 1352 for forming an anode and anode-connected field plate may be patterned in the third layer of resist 1350. The via 1352 is larger than the anode via 1346 in the insulator 120.

A lift-off process may then be carried out to deposit the anode 140 and a first anode-connected field plate 145. An anode deposition may then be performed, as illustrated in FIG. 13-1F, which deposits any suitable anode conductor 1360 having a composition as described above. According to some embodiments, the deposition also forms a first anode-connected field plate 145 that extends beyond the anode 140 over the insulating layer 120. The third layer of resist 1350 and excess anode conductor 1360 may be removed from the substrate using the lift-off process. A resulting Schottky diode structure having a single anode-connected field plate is depicted in FIG. 13-1G.

Subsequently, a second insulating layer 122 may be formed over the substrate. The second insulating layer may be deposited by any suitable deposition process. The second insulating layer may be coated with a fourth photoresist layer 1316, and also patterned to open a via over the first anode-connected field plate 145, as depicted in FIG. 13-1I. The second insulating layer 122 may be etched to expose a region of the first anode-connected field plate 145. The resist 1316 may be stripped, and a fifth layer of resist 1318 deposited and patterned to open a via for a second anode-connected field plate, as depicted in FIG. 13-1J. A suitable conductor for the second anode-connected field plate 147 may then be deposited as part of another liftoff process, for example, as illustrated in FIG. 13-1K. The fifth layer of resist 1318 and excess conductor 1332 may be removed from the wafer.

The processes of depositing an insulating layer and patterning an anode-connected field plate may be repeated to form one or more anode-connected field plates over the second anode-connected field plate.

Other methods of fabricating a Schottky diode are possible. An alternative method is depicted, in part, in FIG. 13-2A through FIG. 13-2F. According to some embodiments, the wafer may comprise a bulk substrate 105, a buffer layer 112, a gallium-nitride conduction layer 114, a barrier layer 116, and an insulting layer 120. A photoresist 1408 may be patterned over the insulating layer 120, as depicted in FIG. 13-2B. The photoresist may be patterned to open an anode via 1418 by any suitable photolithography method, such as projection photolithography. Subsequently, the insulating layer 120 may be etched anisotropically to expose a portion of the barrier layer 116 for subsequent deposition of the anode. The first resist layer 1408 may be stripped from the substrate, and a second layer of resist 1412 deposited and patterned to expose cathode vias 1422, as depicted in FIG. 13-2C.

The insulating layer 120 at the cathode locations may then be etched anisotropically, as depicted in FIG. 13-2D to expose at least the barrier layer 116. In some embodiments, the etch may stop at or part way into the barrier layer. In some implementations, the etch may continue into the conduction layer 114, as depicted. The second resist layer 1412 may then be stripped from the substrate.

A liftoff process may then be carried out to deposit the anode and cathodes. For this process, a third resist layer 1414 may be pattered over the substrate to open up cathode vias 1426 and an anode via 1424, as depicted in FIG. 13-2E. The anode via 1424 may be larger than the opened area in the insulating layer 120 from the previous anode via patterning step. Anode and cathode depositions may then be performed in a single step, as illustrated in FIG. 13-2F. According to some embodiments, the deposition also forms an anode-connected field plate 145 that extends beyond the anode 140 over the insulating layer 120. The third resist layer 1414 and excess conductor 1430 may be removed from the wafer to yield a Schottky diode structure like that depicted in FIG. 13-1G. One or more additional anode-connected field plates may be formed over the first anode-connected field plate 145, as described in connection with FIG. 13-1H through FIG. 13-1K.

According to some embodiments, microfabrication techniques for forming anode-connected field plates may be performed without planarization of the substrate after depositions of the anode and first anode-connected field plate, insulating layers, and subsequent anode-connected field plates. Avoiding planarization steps can reduce the time and cost of device fabrication. In some cases, planarization steps (e.g., chemical-mechanical polishing) may be used after some or all depositions of the anode-connected field plates and insulating layers.

A figure of merit for a Schottky diode is an amount of leakage current that the device allows to flow under reverse-bias conditions. Ideally, a diode would allow no current to flow when reversed biased. However, diodes typically allow a small amount of leakage current to flow under reverse bias, and this leakage current can contribute to power loss or other deleterious effects in the device or in an instrument in which the diode is used.

Leakage current in a semiconductor diode can be due to several different causes. Some of these causes are depicted in FIG. 14. In some cases, surface states 1420 and/or traps 1425 may provide pathways for leakage current. The traps may arise from interfacial defects that form at boundaries between different semiconductor layers. In some cases, leakage current may flow between ohmic contacts 130a, 130b via the two-dimensional electron gas (2DEG) 214, or via a parasitic channel that may form at a boundary between different semiconductor layers. In some devices, leakage current may flow vertically and laterally between ohmic contacts (e.g., along a path 1410 depicted in FIG. 14). For example, the leakage current may flow vertically from one ohmic contact 130b through one or more gallium-nitride layers and buffer layer to the substrate 105, flow laterally along the substrate, and then flow vertically to a second ohmic contact 130a. Ohmic contacts 130a and 130b may be ohmic contacts of different devices.

The inventors have studied leakage current in a test GaN Schottky diode device, and have found ways to significantly reduce leakage current in the device. In a first series of measurements that were carried out to better understand leakage-current characteristics, the test device was reverse biased while leakage-current density $J_r$ was measured. The test device comprised a Schottky diode having a structure like that shown in FIG. 1A. In the test device, the substrate was bulk silicon (Si), over which nucleation or buffer layers 112 comprising AlN were formed. An undoped GaN conduction layer 114 having a thickness of approximately 0.8 microns was epitaxially grown on the buffer layer, and an undoped barrier layer 116 of $Al_{0.27}Ga_{0.73}N$ was grown over the conduction layer. The thickness of the barrier layer was approximately 18 nm. An undoped GaN cap layer 118 having a thickness of approximately 2.5 nm was formed over the barrier layer 116. A silicon-nitride passivation layer 120 was then deposited over the cap layer prior to forming cathode 130 and anode 140 contacts. The cathode edges were spaced approximately one micron from the anode edges. A single anode-connected field plate was formed over the anode.

Results from reverse-bias, leakage-current measurements are shown in FIG. 15. The applied bias was varied between about 0 volts and about −20 volts for six different device temperatures. The reverse-bias characteristics show that the leakage current in the test device is associated predominantly with Fowler-Nordheim tunneling and Frenkel-Poole tunneling. Under Fowler-Nordheim tunneling, the leakage current depends predominantly on applied bias and exhibits little dependence on device temperature. The onset of Fowler-Nordheim tunneling occurs for an applied bias of about −12 volts for the test device. Under Frenkel-Poole tunneling, the leakage current exhibits temperature dependence, and is the predominant form of leakage current for bias values between about −2 volts and about −12 volts. The inventors found that the leakage current results agree well with Fowler-Nordheim and Frenkel-Poole theories.

Different approaches for reducing leakage current were tried. In some devices, mesas were formed to help isolate ohmic contacts. For example, trenches were etched around ohmic contacts in non-active regions to reduce unwanted current flow via surface and trapping states and the 2DEG between ohmic contacts (e.g., between contacts of adjacent devices or other device contacts). The inventors found that mesa formation did not reduce leakage-current flow, and in some cases increased leakage-current flow. The increase in leakage current was believed to be due to the generation of more defect states and surface states from the etching.

In some devices, a silicon-nitride passivation layer 1610 may be formed in regions around ohmic contacts 130a, 130b, as depicted in FIG. 16A. The passivation layer can passivate the surface states 1420 and appreciably reduce a component of leakage current due to surface-state currents. In some devices, ion implantation can be used in non-active regions of the device alternatively, or in addition to, a passivation layer 1610. The ion implantation may form electrical isolation regions 115 within the semiconductor layers, as depicted in FIG. 16B. The ion implantation can damage the crystalline structure, and thereby increase its resistance to leakage current flow.

Several ion species (boron, nitrogen, and phosphorus) were implanted in test devices to determine their effect on leakage current. The inventors found that implanted nitrogen provided the largest reduction in leakage current among the different ion species. Additionally, a larger reduction in leakage current can be obtained when the nitrogen is implanted at a plurality of different energies, so as to extend the damage well into the conduction layer 114. According to some embodiments, nitrogen may be implanted at two or more different energies so that the nitrogen implants to depths between about 0.2 microns and about 0.5 microns below the top surface of the cap layer 118, or below the top surface of the barrier layer 116 if a cap layer is not used.

Although surface passivation and ion implantation provided useful reductions in reverse-bias leakage current, the inventors surprisingly found that the largest reduction in leakage current is obtained when a pre-treatment process is used prior to deposition of the anode 140. In conventional anode patterning and referring to FIG. 13-1E, the passivation layer 120 may be etched to expose the underlying barrier layer 116 or cap layer 118 for the anode contact. The anode may then be deposited in electrical contact with the exposed gallium nitride or AlGaN layer, as depicted in FIG. 13-1F. The inventors have found that prior to depositing the anode, subjecting the exposed layer to an oxygen plasma can significantly reduce reverse-bias leakage current in a gallium-nitride Schottky diode. In some embodiments, the exposed cap or barrier layer is subjected to an $O_2$ plasma having a pressure between about 0.5 Torr and about 3 Torr, and an applied power between about 0.3 kW and about 2 kW. The treatment time may be between about 10 sec and about 2 minutes, according to some embodiments. In some embodiments, the pressure is about 1.5 Torr with a power of about 1.0 kW for a duration of about 30 sec. Referring to the Schottky diode 1700 in FIG. 17, the $O_2$ plasma treatment is believed to form a thin gallium-oxide layer 1710 under the subsequently deposited anode 140. The gallium-oxide layer may be between about 10 Angstroms and about 50 Angstroms-thick. This thin oxide layer does not appreciably affect forward current flow, but significantly reduces reverse-bias leakage current.

In some cases, other gases may be included in the $O_2$ plasma treatment to help passivate the exposed surface. Other gases may include, but are not limited to nitrogen, hydrogen, argon, and forming gas (a mixture of hydrogen and nitrogen having about 5% hydrogen).

A measured reduction in reverse-bias leakage current due to $O_2$ plasma pre-treatment is shown in FIG. 18. Over sixty devices were tested, for which conventional techniques were used to open the nitride passivation layer and form the anode. An exemplary leakage-current curve for these devices is plotted as the upper trace 1810 in the graph. Over sixty similar devices were also tested, but for these devices an $O_2$ plasma pre-treatment was used prior to depositing the anode. An exemplary leakage-current curve for these devices is plotted as the lower trace 1820 in the graph. The reduction in leakage current due to the $O_2$ pre-treatment was approximately a factor of 100.

Schottky diodes have been fabricated by the inventors having multiple anode-connected field plates, electrical isolation regions and passivation layers around ohmic contacts in non-active areas, and using an $O_2$ plasma treatment of the cap layer or barrier layer prior to depositing the anodes. Exemplary reverse-bias current curves are shown in FIG. 19 for two typical devices fabricated on different wafers. Four Schottky diodes were tested from each wafer, and produced similar curves. These diodes are capable of withstanding reverse biases of up to about 2100 volts. The reverse-bias leakage currents are between approximately 0.1 microamps and approximately 10 microamps over this range of reverse bias voltages. The diodes had anode and cathode widths of approximately 250 microns, so the reverse leakage current values correspond to about 0.4 µA/mm and about 40 µA/mm of anode width $W_a$. The difference in value of reverse-bias current for the two curves is believed to be due to differences in oxide thickness formed by the $O_2$ plasma treatment for the different wafers. The reverse bias tests were carried out by applying DC voltages. The diodes were capable of withstanding such high reverse-bias voltages for extended periods of time (greater than one second).

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A Schottky diode comprising:
   a gallium-nitride conduction layer;
   a buffer layer formed between the gallium-nitride conduction layer and a substrate, wherein a combined thickness of the buffer layer and gallium-nitride conduction layer is at least 4.5 microns;
   a barrier layer formed adjacent to the gallium-nitride conduction layer;
   a first cathode and a second cathode spaced apart and in electrical contact with the conduction layer;
   an anode formed adjacent to the barrier layer between the first cathode and the second cathode, wherein the barrier layer extends under the anode between the anode and the gallium-nitride conduction layer; and
   at least one anode-connected field plate electrically connected to the anode and extending on opposite edges beyond the anode toward the first cathode and the second cathode, wherein outer edges of any one of the at least one anode-connected field plate are spaced at least 3 microns from the first cathode and the second cathode and the Schottky diode is capable of withstanding a reverse bias voltage as much as 1000 volts, wherein the at least one anode-connected field plate comprises a first field plate contacting the anode and a second field plate above the first field plate and contacting the first field plate only at non-outer edge portions,
   wherein the at least one anode-connected filed plate comprises a first field plate contacting the anode and a second field plate above and contacting the first field plate only at non-outer-edge portions thereof.

2. The Schottky diode of claim 1 capable of withstanding a reverse bias voltage as much as 1200 volts.

3. The Schottky diode of claim 1, wherein the substrate comprises silicon.

4. The Schottky diode of claim 1, wherein the barrier layer comprises aluminum gallium nitride.

5. The Schottky diode of claim 1, further comprising a gallium-nitride cap layer formed over the barrier layer.

6. The Schottky diode of claim 1, further comprising electrical isolation regions formed adjacent to the first cathode and the second cathode, wherein the electrical isolation regions comprise damaged crystalline semiconductor that includes one or more of the following implanted ion species: nitrogen, phosphorous, boron, and argon.

7. The Schottky diode of claim 1, further comprising at least one additional anode spaced laterally from the first or second cathode and electrically connected to the anode.

8. The Schottky diode of claim 1, wherein a distance between an edge of the first or second cathode and an edge of the anode is less than 20 microns.

9. The Schottky diode of claim 1, wherein a distance between an edge of the first or second cathode and an edge of the anode is less than 15 microns.

10. The Schottky diode of claim 1 wherein
    the first field plate electrically connected to the anode and extends on opposite edges beyond the anode toward the first cathode and the second cathode by a first distance; and
    the second field plate extends on opposite edges beyond the first field plate toward the first cathode and the second cathode by a second distance.

11. The Schottky diode of claim 10, wherein the second distance is less than the first distance.

12. The Schottky diode of claim 10, further comprising:
    a first insulating dielectric layer between at least a portion of the barrier layer and at least a portion of the first anode-connected field plate; and
    a second insulating dielectric layer separating at least a portion of the first anode-connected field plate and at least a portion of the second anode-connected field plate.

13. The Schottky diode of claim 12, wherein a thickness of the first insulating dielectric layer is between approximately 30 nm and approximately 100 nm, and a thickness of the second insulating dielectric layer is between approximately 300 nm and approximately 600 nm.

14. The Schottky diode of claim 10, wherein a distance between an outer edge of the second field plate and an outer edge of the first field plate is between approximately 1 micron and approximately 4 microns.

15. The Schottky diode of claim 10, wherein an outer edge of the anode, an outer edge of the first field plate, and an outer edge of the second field plate lie approximately along a curve bending away from the barrier layer.

16. The Schottky diode of claim 10, wherein the anode, first cathode, second cathode, and first field plate are formed of a same material.

17. The Schottky diode of claim 10, wherein the at least one anode-connected field plate further comprises a third field plate electrically connected to the second field plate and extending on opposite edges beyond the second field plate toward the first cathode and the second cathode by a third distance.

18. The Schottky diode of claim 17, capable of withstanding a reverse bias voltage as much as 1500 volts.

19. The Schottky diode of claim 17, capable of withstanding a reverse bias voltage as much as 2000 volts.

20. The Schottky diode of claim 17, wherein the third distance is less than the second distance.

21. The Schottky diode of claim 17, wherein an outer edge of the anode, an outer edge of the first field plate, an outer edge of the second field plate, and an outer edge of the third field plate lie approximately along a curve bending away from the barrier layer.

22. The Schottky diode of claim 17, wherein a distance between the first or second cathode and an edge of the anode is between approximately 10 microns and approximately 20 microns.

23. The Schottky diode of claim 1, included in a power converter.

24. A Schottky diode comprising:
- a gallium-nitride conduction layer;
- a buffer layer formed between the gallium-nitride conduction layer and a substrate;
- a barrier layer formed adjacent to the gallium-nitride conduction layer;
- a first cathode and a second cathode spaced apart and in electrical contact with the conduction layer;
- an anode formed adjacent to the barrier layer and laterally spaced between the first cathode and the second cathode; and
- a plurality of anode-connected field plates electrically connected to the anode and extending on opposite edges beyond the anode toward the first cathode and the second cathode, wherein an outer edge of a first anode-connected field plate adjacent to the anode does not contact an adjacent second anode-connected field plate and wherein the Schottky diode is capable of withstanding a reverse bias voltage as much as 1000 volts, wherein an edge of the anode is spaced no more than 10 microns from an edge of the first cathode, and wherein the first and second anode-connected field plates contact each other at their center portions.

\* \* \* \* \*

UNITED STATES PATENT AND TRADEMARK OFFICE
CERTIFICATE OF CORRECTION

PATENT NO. : 10,651,317 B2
APPLICATION NO. : 15/223455
DATED : May 12, 2020
INVENTOR(S) : Kaleta et al.

Page 1 of 1

It is certified that error appears in the above-identified patent and that said Letters Patent is hereby corrected as shown below:

In the Claims

At Column 21, Line 62, in Claim 1, delete "filed plate," and replace with -- field plate --.

Signed and Sealed this
Twenty-ninth Day of June, 2021

Drew Hirshfeld
*Performing the Functions and Duties of the
Under Secretary of Commerce for Intellectual Property and
Director of the United States Patent and Trademark Office*